United States Patent [19]

Inoue et al.

[11] Patent Number: 5,845,332
[45] Date of Patent: Dec. 1, 1998

[54] NON-VOLATILE MEMORY, MEMORY CARD AND INFORMATION PROCESSING APPARATUS USING THE SAME AND METHOD FOR SOFTWARE WRITE PROTECT CONTROL OF NON-VOLATILE MEMORY

[75] Inventors: Manabu Inoue, Akishima; Takao Okubo, Ome; Shigeru Kadowaki, Akishima; Satoru Nakanishi, Fuchu; Masamichi Kishi, Tachikawa; Shigeru Suzuki, Kokubunji; Yasuro Kubota, Higashiyamato; Hironori Iwasaki, Fuchu, all of Japan

[73] Assignees: Hitachi, Ltd.; Hitachi ULSI Engineering Corp., both of Tokyo; Hitachi Tohbu Semi-conductor, Ltd., Iruma-gun, all of Japan

[21] Appl. No.: 510,074

[22] Filed: Aug. 1, 1995

[30]      Foreign Application Priority Data

Aug. 3, 1994   [JP]   Japan .................................. 6-182230

[51] Int. Cl.$^6$ ...................................................... G06F 12/16
[52] U.S. Cl. ............................ 711/163; 711/103; 365/195
[58] Field of Search ................................... 395/430, 479,
                395/490; 365/195, 218, 185.11, 185.29,
                                                 185.33; 711/103, 152, 163

[56]            References Cited

U.S. PATENT DOCUMENTS

| 4,975,878 | 12/1990 | Boddu et al. ....................... | 365/185.07 |
| 5,363,334 | 11/1994 | Alexander et al. ................. | 365/185.04 |
| 5,469,564 | 11/1995 | Junya ................................. | 395/188.01 |
| 5,513,136 | 4/1996 | Fandrich et al. .................... | 365/185.04 |
| 5,524,231 | 6/1996 | Brown ................................. | 395/428 |
| 5,546,561 | 8/1996 | Kynett et al. ........................ | 395/490 |

OTHER PUBLICATIONS

Markus Levy, "Series 2 + Flash Memory Card User's Manual", pp. 2–6, 2–7, 2–24, 4–12, and 5–11. (Intel Corporation, Nov. 1993).

Intel, Series 2 Flash Memory Cards iMC002FLSA, iMC004FLSA, iMC010FLSA, iMC020FLSA, Oct. 1993, pp. 6–37 through 6–49.

Intel, Series 2+ Flash Memory Cards 4 and 20 Megabytes, iMC004FLSP, iMC020FLSP, Dec. 1993, pp. 6–6 through 6–18.

*Primary Examiner*—Eddie P. Chan
*Assistant Examiner*—Gary J. Portka
*Attorney, Agent, or Firm*—Antonelli, Terry, Stout & Kraus, LLP

[57]            ABSTRACT

A non-volatile memory, such as a flash memory card, using a rewritable non-volatile memory is provided with an improved write-protect arrangement. The non-volatile memory includes a collectively electrically erasable and writable memory (e.g., a flash memory), a reset IC for generating a power-on reset signal upon turn-on of the power supply, and a card controller for performing control between each flash memory device and a memory card interface. The flash memory is set with a write protect save register written with an address of an area desired to be subjected to write protect, the write protect save register belonging to an attribute area, and a protect range is set from the system. Since the address to be write-protected is itself written in the non-volatile flash memory, the address will continue to be stored, even if the power is turned off. A method for software write protection control is also provided.

1 Claim, 23 Drawing Sheets

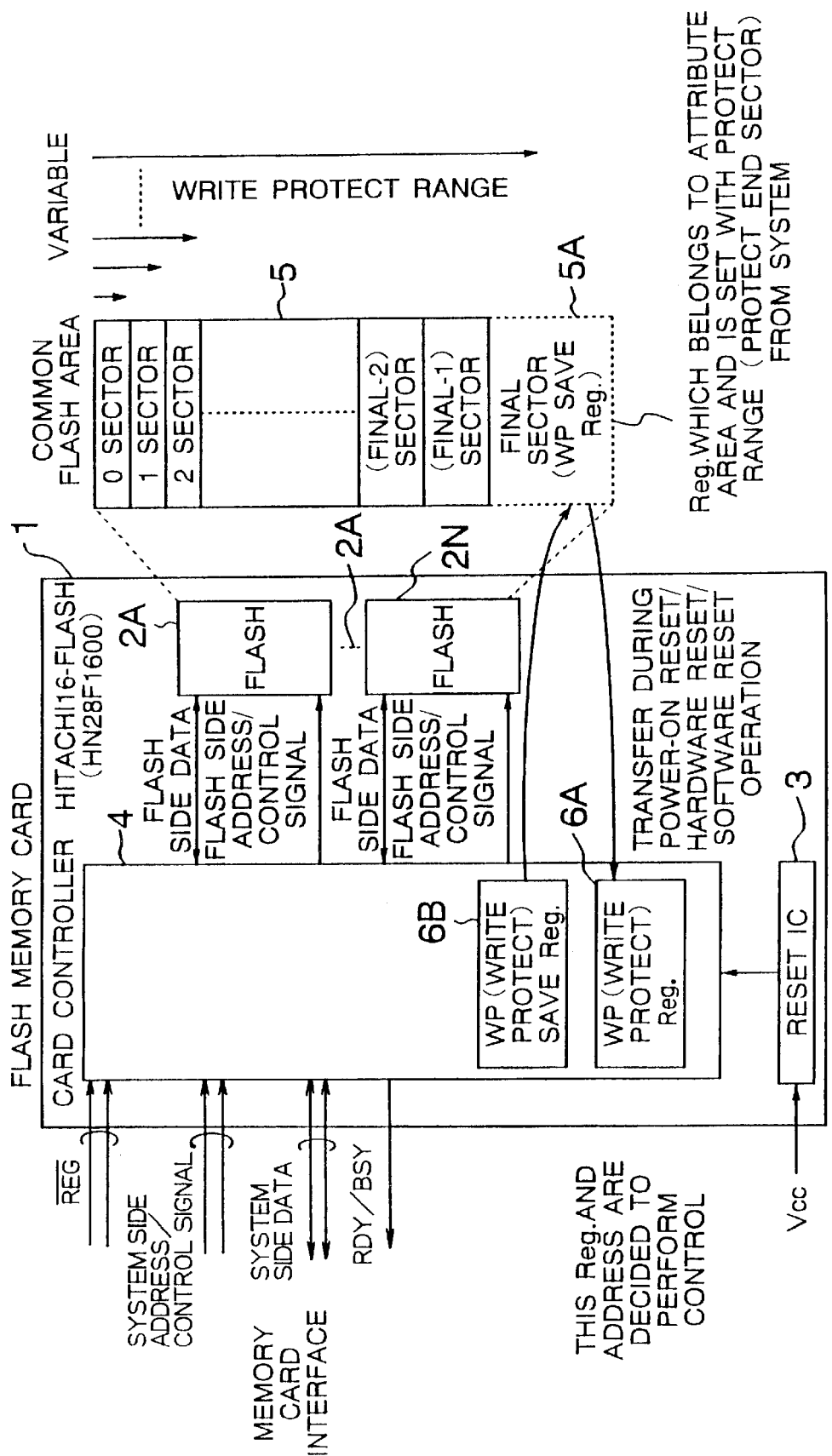

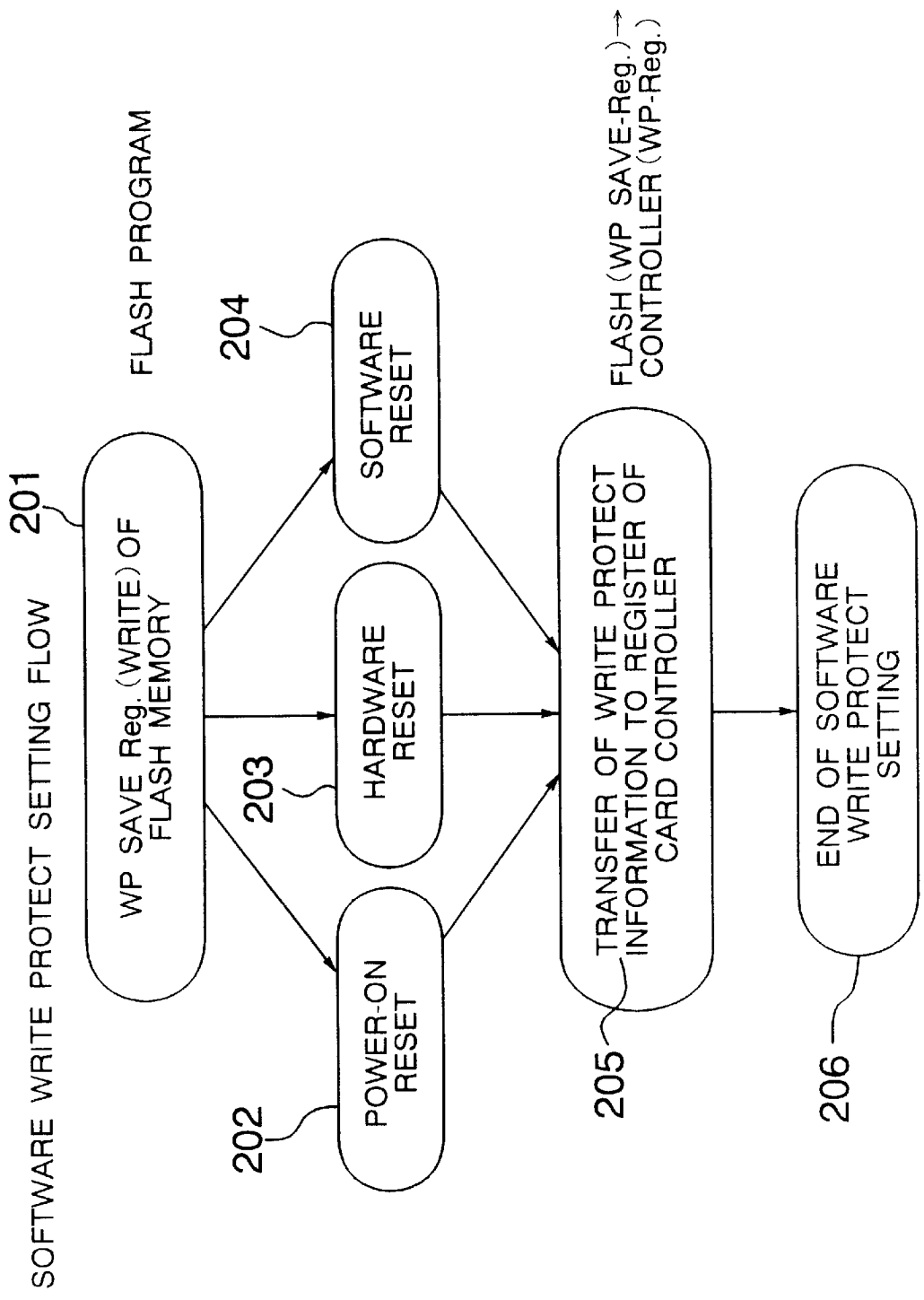

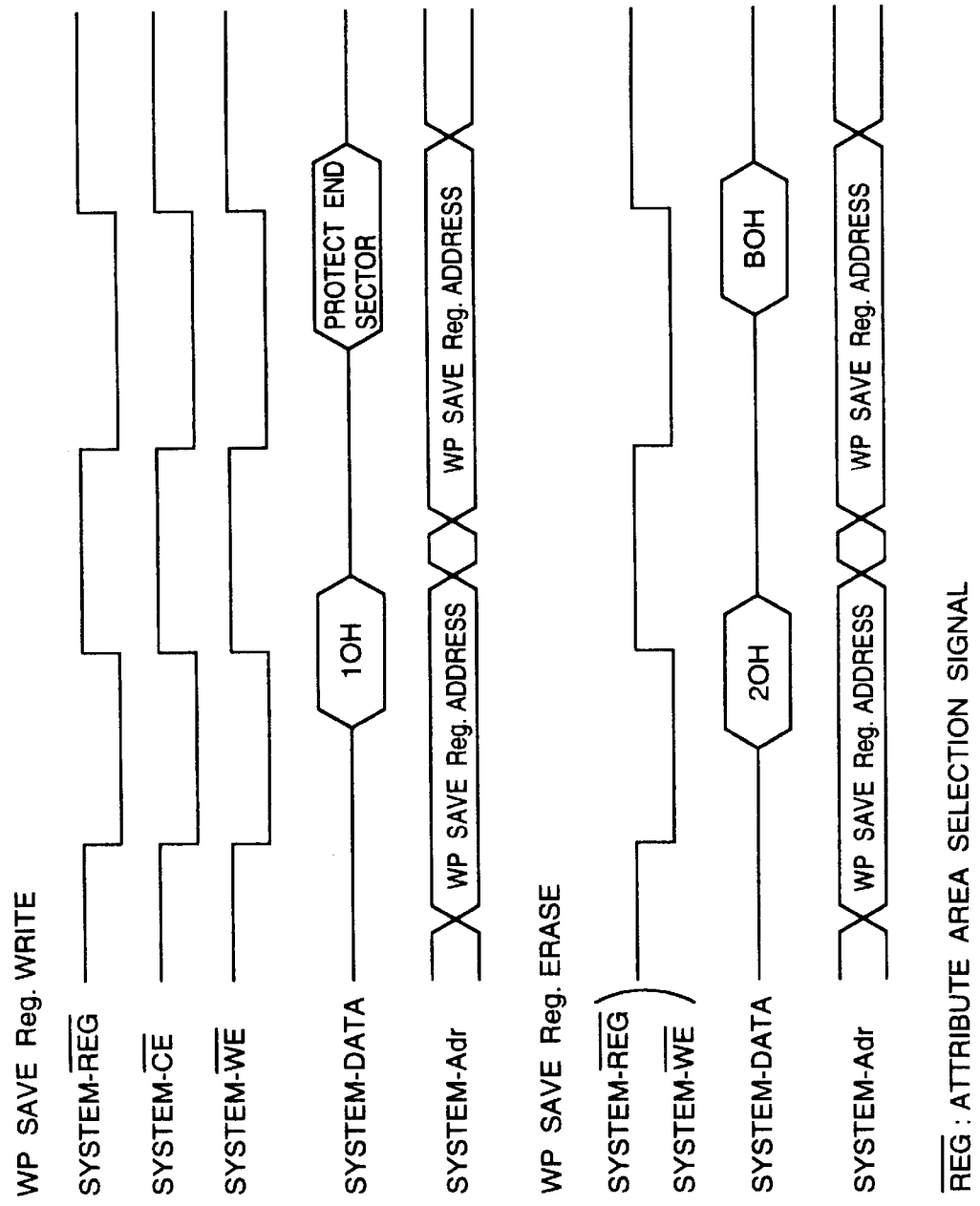

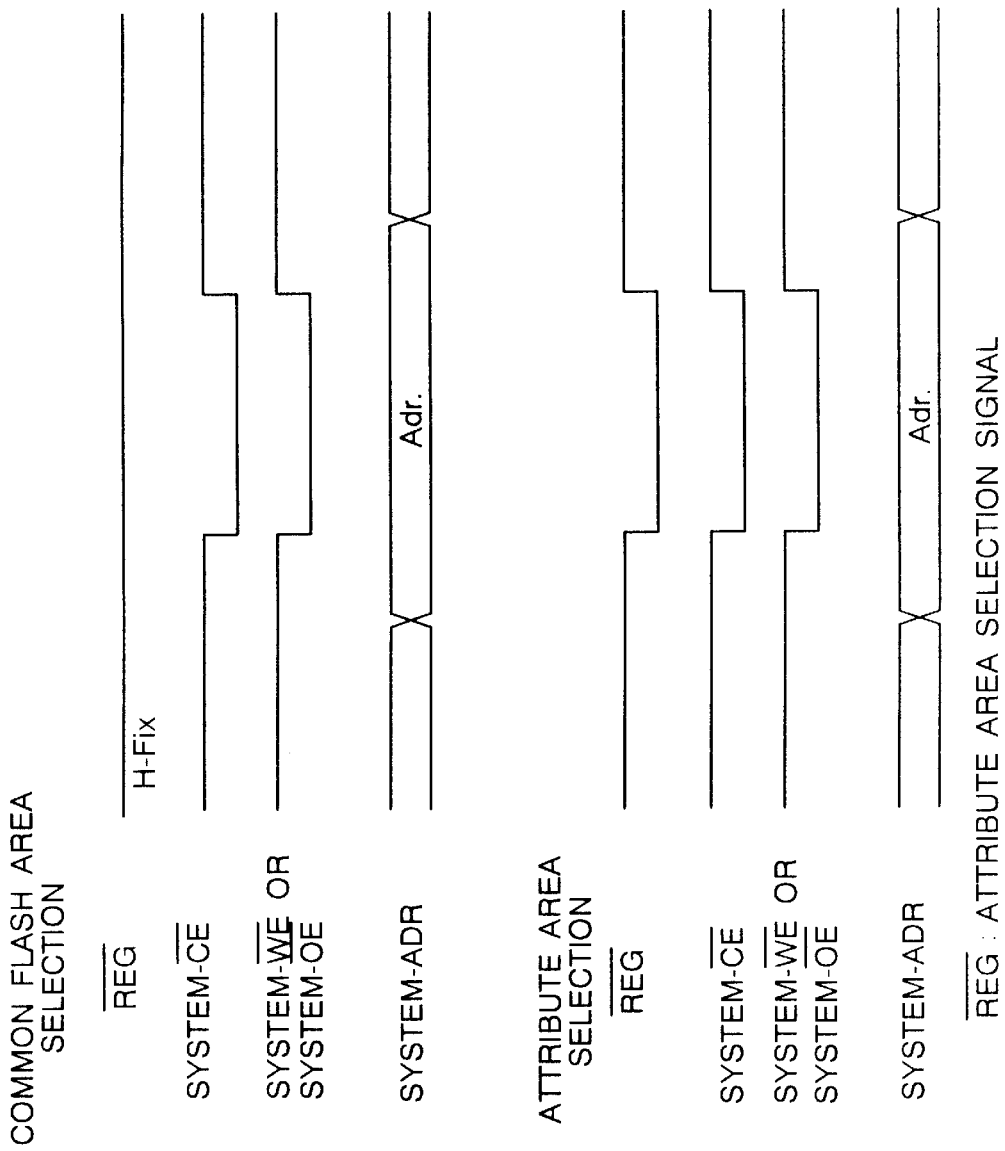

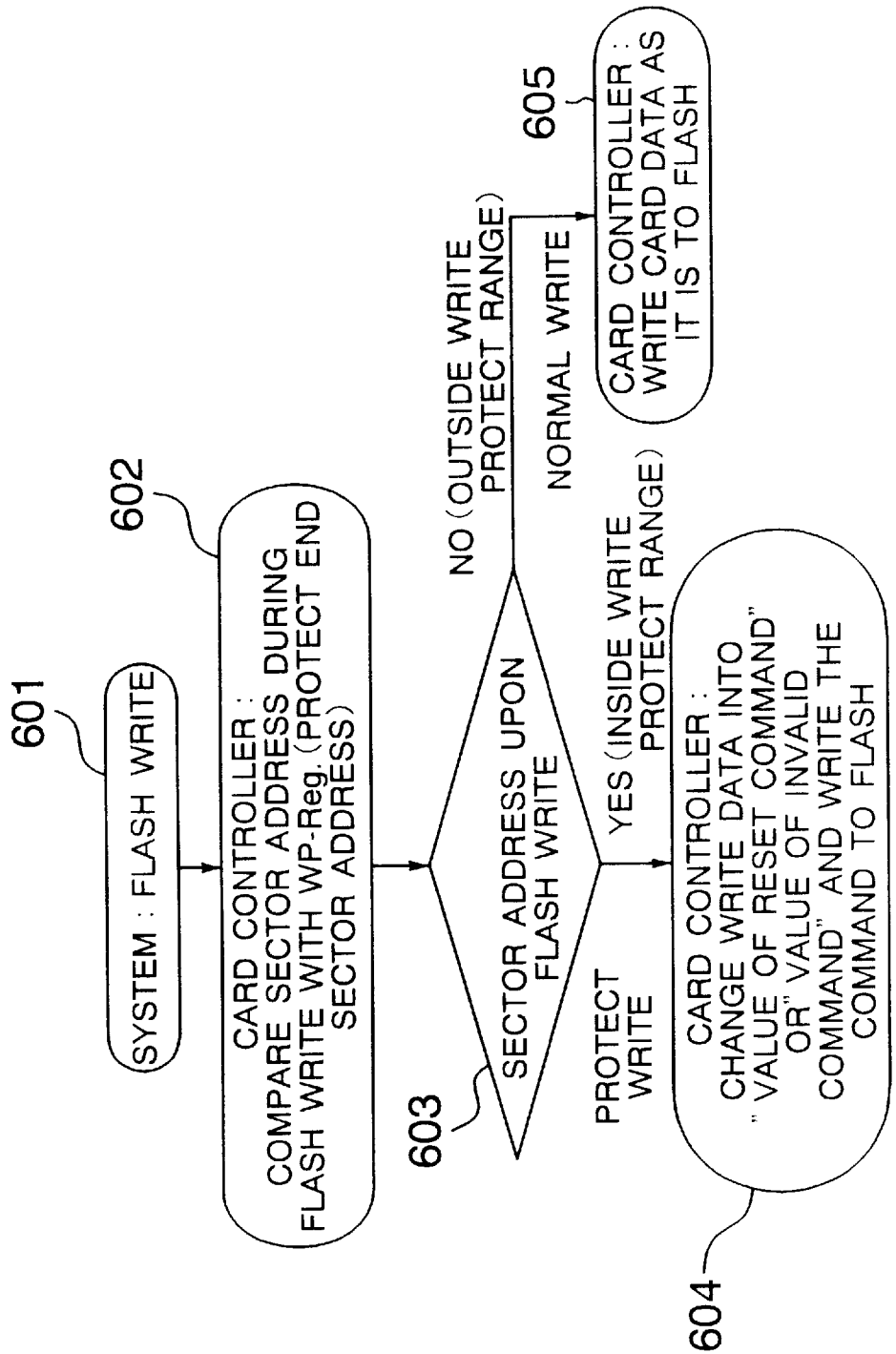

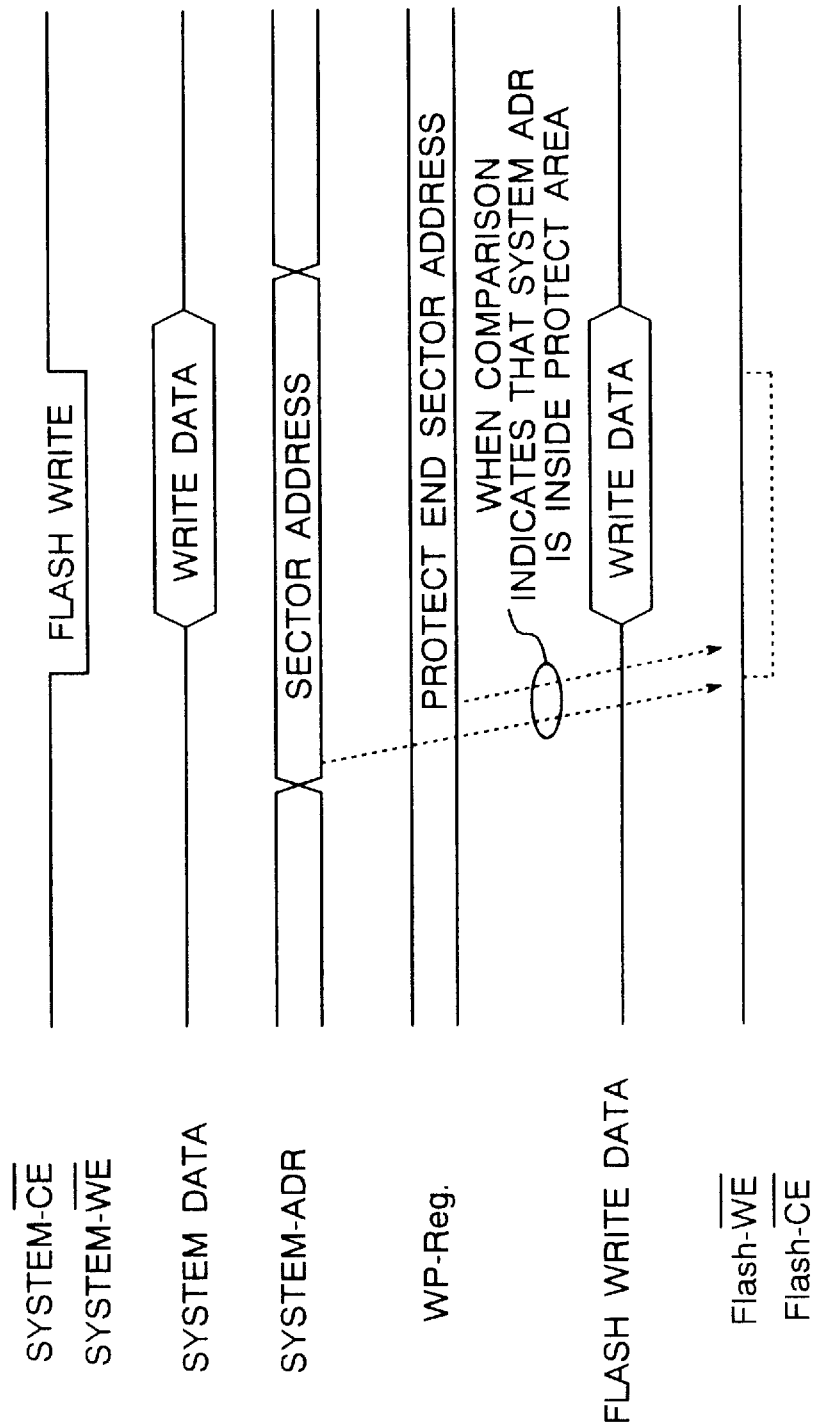

NON-VOLATILE MEMORY, MEMORY CARD AND INFORMATION PROCESSING APPARATUS USING THE SAME AND METHOD FOR SOFTWARE WRITE PROTECT CONTROL OF NON-VOLATILE MEMORY

BACKGROUND OF THE INVENTION

The present invention relates to a non-volatile memory and a system technique using the same. More particularly, the present invention relates to a technique effective for application to a non-volatile memory which can permit non-volatile software write protect, a memory card and an information processing apparatus each using the non-volatile memory and to a method for software write protect control of the non-volatile memory, in a system using a rewritable non-volatile memory inherently without non-volatile software write protect function, for example, general information processing apparatus, general memory cards and non-volatile memory devices.

For example, the Series 2+ flash memory card of Intel Corp. has been put on market as a flash memory card using a flash memory (flash EEPROM) serving as a non-volatile memory and having the non-volatile software write protect function. The flash memory card uses a flash memory of Intel Corp., having by itself a write protect function in a unit of an erase block.

The "software write protect function" termed herein differs from a "hardware write protect function" based on a write inhibit switch, thus having a meaning of software which permits the user (system) to set, at will, a write inhibit field inside a flash memory area (programmable memory control function), and execution of write protect pursuant to this software can be defined as software write protect.

Incidentally, in the prior art flash memory card mentioned above, the flash memory per se has the write protect function, thus permitting software write protect, but in a memory card using a flash memory having no capability to perform a write protect function at a desired storage area, rewritable non-volatile software write protect of a write protect area is not allowed.

SUMMARY OF THE INVENTION

Accordingly, an object of the present invention is to provide, in a memory card and an information processing apparatus using a semiconductor non-volatile memory such as a flash memory inherently without a write protect function, a non-volatile memory which can perform non-volatile software write protect by setting a write protect save register in the non-volatile memory, a memory card and an information processing apparatus which use the non-volatile memory and a method for software write protect control of the non-volatile memory.

Of the invention disclosed in the present application, typical aspects will be described briefly in the following discussion.

More particularly, a non-volatile memory according to one aspect of the present invention is applied to a rewritable non-volatile memory inherently without non-volatile software write protect function, wherein to permit non-volatile software write protect control, a write protect save register which is written, in a unit of predetermined erase, with an address of a desired write protect area is set inside the non-volatile memory.

In this case, to permit application to, for example, a flash memory, the write protect area is variably set an erase unit lying between a heading store location and a desired store location of the non-volatile memory, between a final location and a desired location or between a desired location and another desired location, and the erase unit is variably set as a unit of a sector or a unit of block of a device.

A memory card according to another aspect of the present invention uses the aforementioned non-volatile memory, including the non-volatile memory and a card controller for performing control between the non-volatile memory and at least a memory card interface.

Further, an information processing apparatus according to another aspect of the present invention uses the aforementioned non-volatile memory, including the non-volatile memory, and at least a CPU and peripheral units associated with the CPU.

Further, in a method for software write protect control of non-volatile memory according to another aspect of the present invention, an address of a desired write protect area is written to a write protect save register inside the non-volatile memory, and an address accessed from the user is determined as to whether to be inside the write protect field by using the written address, thereby performing non-volatile software write protect control.

With the above non-volatile memory, the memory card and the information processing apparatus each using the non-volatile memory and the method for software write protect control of the non-volatile memory, a final address, for example, of a collectively electrically erasable and rewritable flash memory is set as a write protect save register belonging to an attribute area, and an address of an area for which write protect is desired to be effected is written into the write protect save register.

In this case, pursuant to an area variable protect scheme, the write protect area can be set in compliance with function specifications of the flash memory in a unit of sector defined either sector by sector beginning with a heading sector, a final sector or a desired sector of the flash memory or two sectors by two sectors representative of a unit of data of 512 bytes (4096 bits), or in a unit of block defined between a heading block, a final block or a desired block and another desired block, the block being a device block representative of a set of data pieces of several sectors.

Further, write data written into the write protect save register of the flash memory is transferred to the write protect register in the card controller by applying, to the card controller, a hardware reset operation by an input from the system side, a software reset operation by register write from the system side or a power-on reset operation upon turn-on of the power supply.

Thereafter, it is decided by the card controller whether an address accessed from the user side is inside the write protect area, and write protect is allowed when the accessed address is determined as being inside the write protect area whereas write protect is not allowed when the accessed address is outside the write protect area, thereby ensuring that software protect control can be permitted in a predetermined erase unit.

Thus, write protect information can be made to be non-volatile and write protect in a desired area of the flash memory can be allowed by using the write protect save register of the flash memory, and in the memory card and the system such as an information processing apparatus both using a rewritable non-volatile memory such as a flash memory otherwise without a software write protect function, capability to maintain write protect information and data in the write protect area can be promoted.

Further, since write protect in a desired area of the flash memory can be allowed, the protect area of the flash memory at which write is inhibited by software write protect and the work area, other than the protect area, at which write is not inhibited can be set in compliance with the system, thereby permitting efficient utilization of the non-volatile memory.

The above and other objects, novel features and advantages of the present invention will become clear from the following description of the embodiments given in conjunction with the accompanying drawings.

BRIEF DESCRIPTION OF THE DRAWINGS

FIG. 1 is a block diagram showing the construction of a memory card using a non-volatile memory according to Embodiment 1 of the present invention.

FIG. 2 is a flow chart of software write protect setting in Embodiment 1.

FIG. 3A is a timing chart showing operation of the write procedure (step) by a write protect save register of FIG. 2.

FIG. 5B is a timing chart for explaining a method of selecting a common flash area and an attribute area.

FIG. 6 is a flow chart of write protect control in Embodiment 1.

FIG. 16A is a timing chart of write protect control in Embodiment 6 of FIG. 15.

Like reference numerals or symbols represent like elements or components throughout the embodiments.

DESCRIPTION OF THE PREFERRED EMBODIMENTS

Figure 3B:
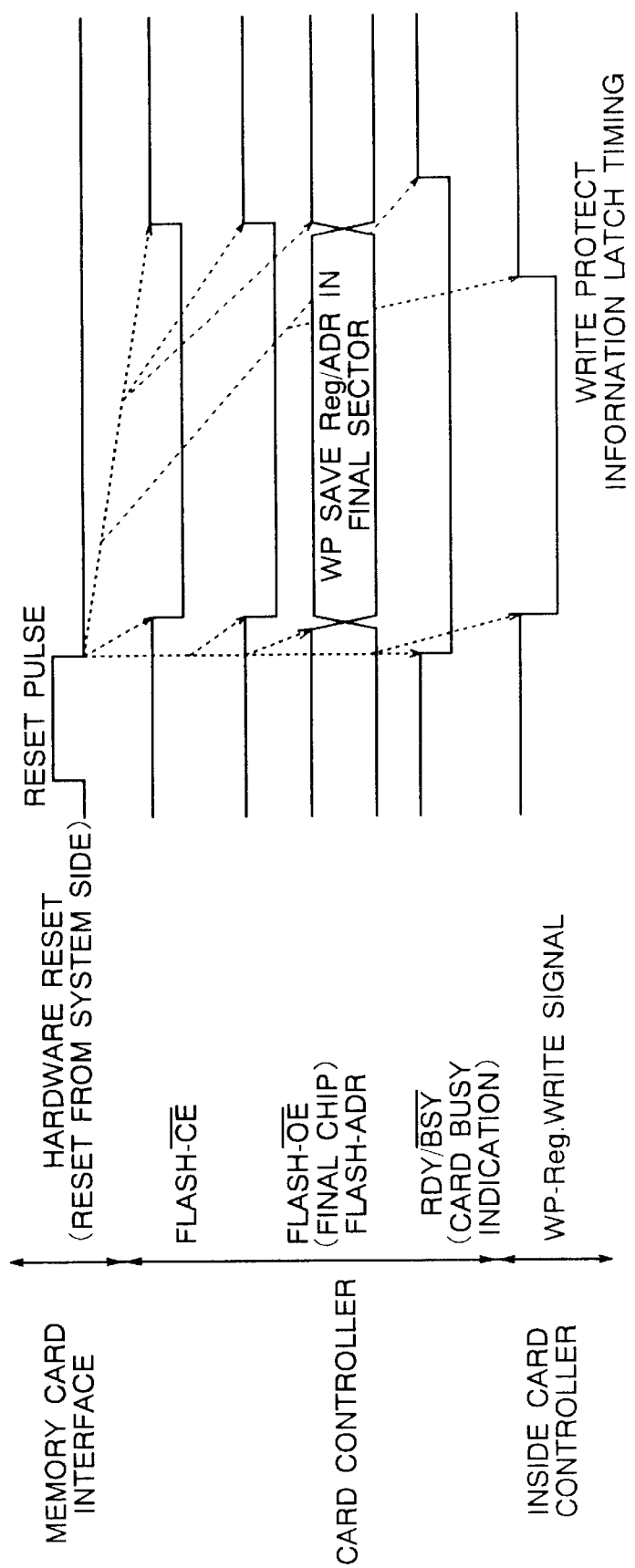
FIG. 3B is a timing chart of write protect information transfer in FIG. 2.

The present invention will now be described in greater detail by way of example with reference to the accompanying drawings.

The construction of a memory card using a non-volatile memory according to an embodiment 1 of the present invention is shown in block form in FIG. 1.

Exemplified as the memory card of the present embodiment is a flash memory card 1 using a rewritable non-volatile memory not having a software write protect function therein, for example, a flash memory of type HN28F160 manufactured by Hitachi Ltd. The flash memory card 1 is comprised of a collectively electrically erasable and writable flash memory (non-volatile memory) 2 having flash memory devices (chips) 2A to 2N, a reset integrated circuit (IC) 3 for generating a power-on reset signal when the power supply is turned on, and a card controller 4 for performing a control operation between each flash memory device and a memory card interface.

In the present embodiment, the flash memory 2 including the flash memory chips 2A to 2N carried on the flash memory card 1 is set with a write protect save register (WP save Reg.) 5A in, for example, a final chip of a common flash area 5 defining a memory space of the flash memory, that is, in a final one of sectors each being of a unit of data (512 bytes), the write protect save register 5A being adapted to be written with an address of a memory area for which write protect is desired to be performed and belonging to an attribute area, and a protect range, i.e., a protect end sector can be set in the write protect save register from the system.

The attribute area is defined as representing a memory area which stores information for identification of the flash memory card 1 registers in the card controller and configuration information for indicating the construction of hardware and indicating which address space of the system the flash memory card 1 is assigned to.

The write protect range of the write protect save register 5A is set pursuant to a variable protect scheme so as to extend from, for example, a heading (0) sector of the common flash area to a desired sector inclusive of a (final-1) sector because the flash memory 2 is erased in a predetermined erase unit corresponding to a unit of a sector, for example, 512 bytes. The erase unit is set in compliance with function specifications of the flash memory 2.

A write protect save register 6B is provided in the card controller 4, in which a write protect signal is written by the control of the card controller into the save register 5A in the flash memory upon writing of the write protect to the memory side, as will be described below concerning the register 6B. Also provided in the card controller 4 is a write protect register (WP Reg.) 6A which stores write data from the write protect save register 5A of the flash memory 2, in response to a power-on reset operation upon turn-on of the power supply, a hardware reset operation caused by a reset signal from the system side using the flash memory card 1 or a software reset operation performed at the time that the system side performs writing to a software reset register set in the card controller 4.

In operation of the present embodiment, the write protect setting procedure based on FIG. 2 will first be described by making reference to FIG. 1. Control operation of a write protect setting as well as transfer control of write protect information and write protect control to be described later are carried out by logic circuits of logic devices constituting the card controller 4.

Firstly, a final chip 2N or final sector of the flash memory 2 carried on the flash memory card 1 is set as the write protect save register 5A. This register 5A belongs to an attribute area and is written with a write protect end address to set a write protect range (step 201).

Since the write protect save register 5A at the final chip 2N or final sector of the flash memory 2 is inside the flash memory 2, information saved in the register 5A can be held in the form of non-volatile information unless the information is rewritten or the flash memory 2 is destroyed.

Further, in order to transfer the information written in the write protect save register 5A to, for example, the register 6A of the card controller, a power-on reset operation upon turn-on of the power supply, a hardware reset operation caused by an input from the system or a software reset operation caused by writing to the register by the system is involved (steps 202 to 204).

Through this, the written information can be transferred to the write protect register 6A set in the card controller 4, thus completing software write protect setting (steps 205 and 206).

After the write protect information has been transferred to the write protect register 6A, an address accessed from the system is compared with the write protect end address written in the write protect register 6A, and write protect control is allowed to be carried out in accordance with a result of the comparison.

Transfer of the write protect information based on timing charts of FIGS. 3A and 3B will now be described with reference to FIG. 4.

Figure 4:
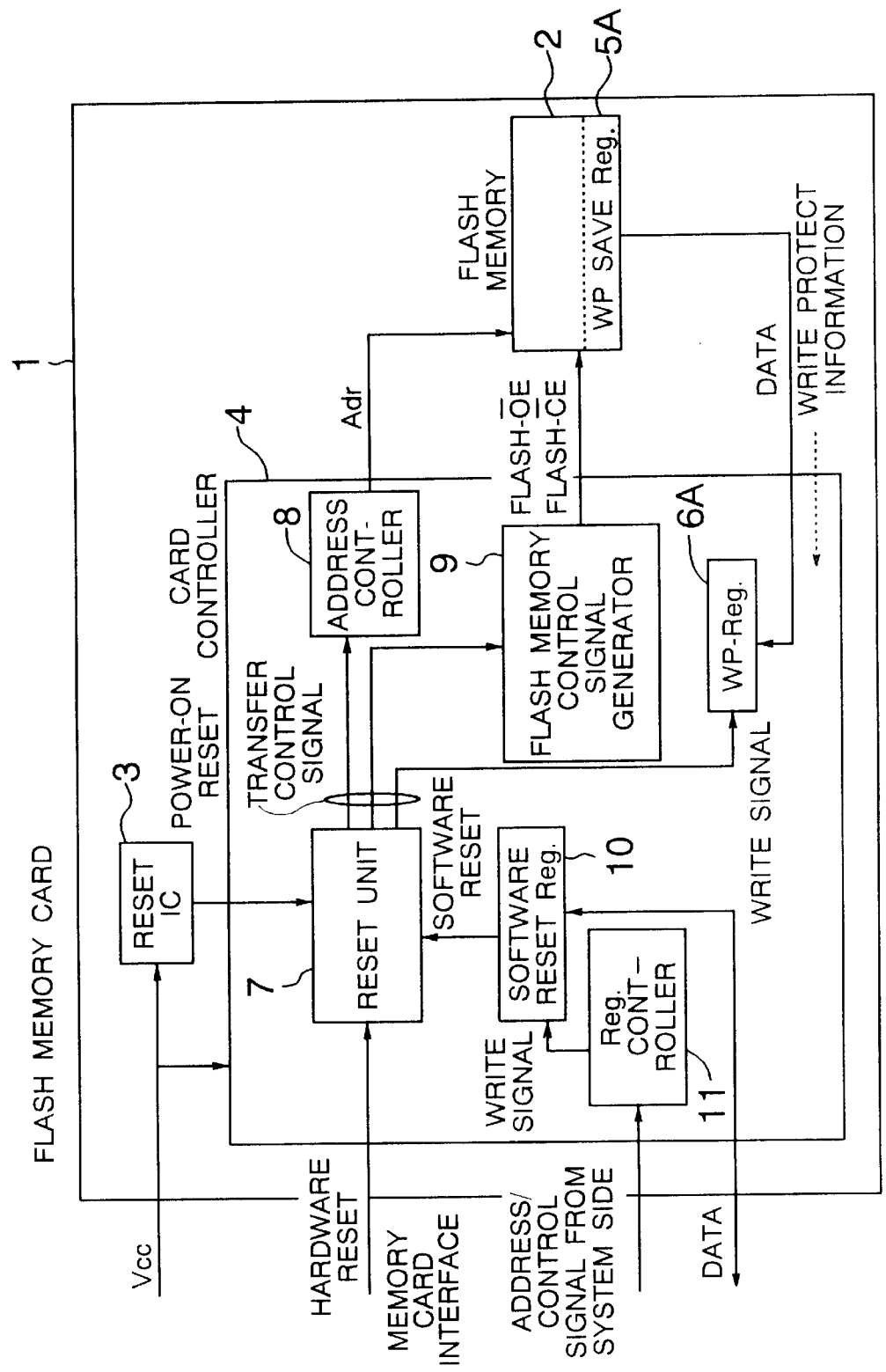
FIG. 4 is a circuit block diagram of a memory card of a write protect information transfer system in Embodiment 1.

It will first be seen from FIG. 4 that for the purpose of performing the write protect information transfer function, the card controller 4 includes in addition to the write protect register 6A a reset unit 7 which generates a signal for transfer by using a reset pulse due to a power-on reset operation, a hardware reset operation or a software reset operation, an address controller or address control unit 8 for generating an address when a write/read operation to and from the flash memory 2 is carried out, a flash memory control signal generator 9 for generating a chip enable signal and an output enable signal, a software reset register 10 for initializing registers set in the card controller 4 and generating a reset pulse in response to a software reset operation, and a register controller 11 for controlling the software reset register 10 in response to an address/control signal from the system side.

In the write the operation of a write protect signal to the save register 5A, when a WP end address is written to the WP save register 6B not shown in FIG. 4 on the basis of an attribute area select signal $\overline{REG}$ from the user system as shown in FIG. 3A, the write protect end address is written by the control signal generator 9 from the WP save register 6B of the controller 4 to the WP save register 5A inside the flash memory 2. Subsequently, during a hardware reset operation, for example, a reset pulse as shown in FIG. 3B inputted from the system side to the reset unit 7 is used to generate a signal for transfer, as discussed with regard to below the card controller 4.

More particularly, in the card controller 4, the address controller 8 generates a signal (Adr) indicative of an address for the write protect register 5A in the flash memory 5 on the basis of the signal from the reset unit 7. In response to the signal from the reset unit 7, the flash memory control signal generator 9 generates a chip enable signal ($\overline{CE}$) and an output enable signal ($\overline{OE}$) which are both at low level.

The reset unit 7 also generates a latch signal which latches, in the write protect register 6A inside the card controller 4, write protect information read out by the thus generated address signal for the write protect save register, a chip enable signal and an output enable signal.

Thus, during the hardware reset operation, the write protect information read out of the write protect save register 5A of the flash memory 2 can be transferred to the write protect register 6A inside the card controller 4 and can be latched therein.

During a software reset operation, a write signal is generated from the register controller 11 inside the card controller 4 by using an address control signal for register write from the system side. The write signal is fed to the software reset register 10, with the result that the software reset register 10 is written with "1" and then with "0" to generate a software reset pulse.

The software reset pulse is applied to the reset unit 7, so that a signal for transfer is generated inside the card controller 4 as in the case of the hardware reset operation and write protect information can be transferred from the write protect save register 5A to the write protect register 6A.

Further, during a power-on reset operation, a power-on reset pulse is generated by the reset IC 3 when the power supply of the flash memory card 1 is turned on and the power-on reset pulse is applied to the reset unit 7, so that a signal for transfer is generated as in the case of the hardware reset operation and write protect information can be transferred from the write protect save register 5A to the write protect register 6A.

Next, write protect control based on a flowchart such as shown in FIG. 6 will be described with reference to FIGS. 5A and 5B and FIGS. 7 to 9.

Figure 5A:
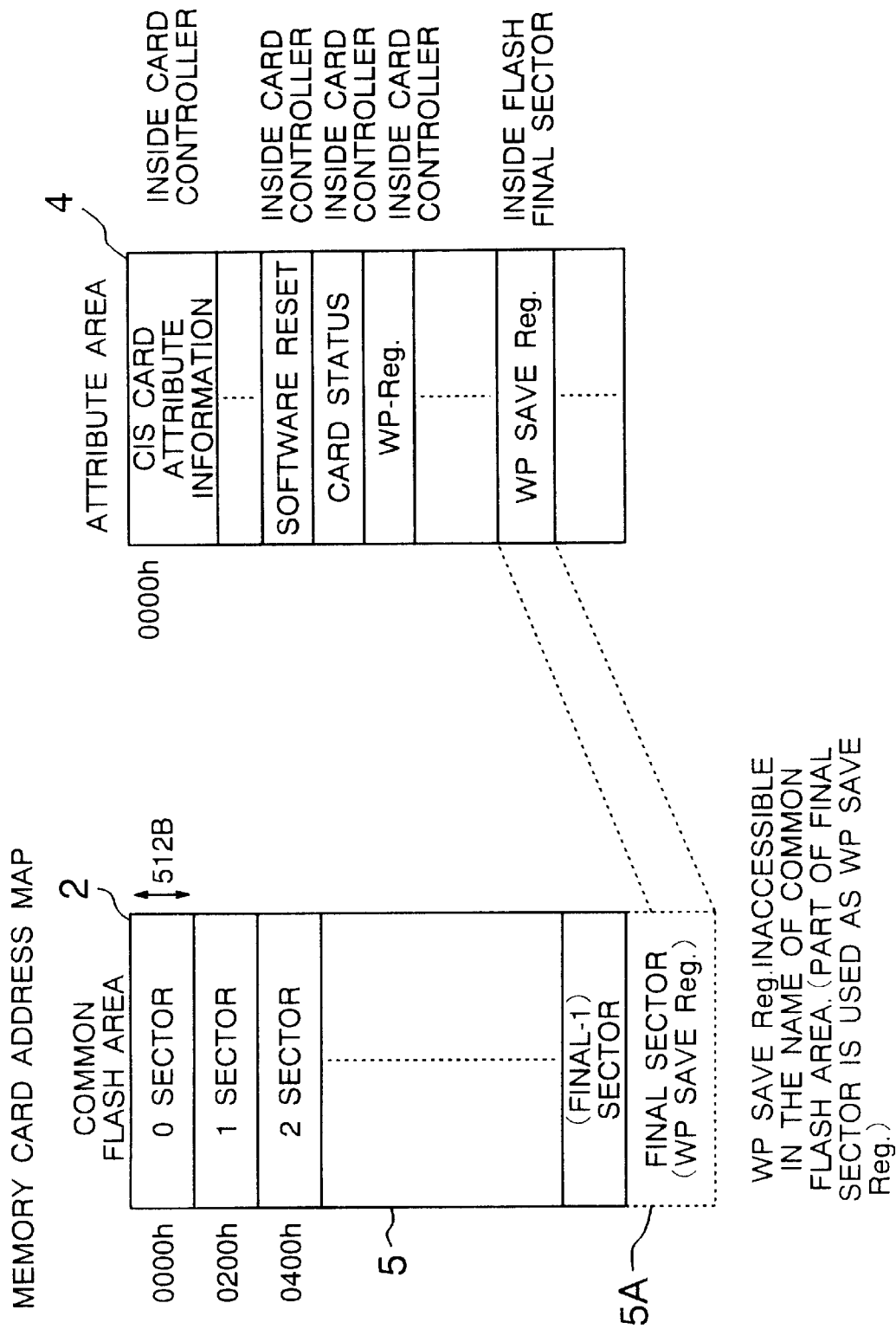
FIG. 5A is a diagram useful to explain an address map of the memory card in Embodiment 1.

It is first understood that the flash memory card 1 has a structure of address mapping as shown in FIG. 5A and the write protect save register 5A is set in the final chip or final sector of a common flash area 5 and therefore, this sector belongs to an attribute area and cannot be accessible in the name of the common flash memory area. The attribute area includes a card configuration structure (CIS) register and a plurality of registers such as a software reset register, a card status register and a WP register, the CIS register and the plurality of registers being set in the card controller.

Shown in FIG. 5B is a timing chart which indicates an operation for selecting the common flash area and the attribute area. The common flash area and the attribute area are accessed in different ways which depend on whether an attribute area selection signal $\overline{REG}$ is asserted or not. For example, when reading data at an address of 4000H, even for the same 4000H address, data at a 4000H address in the attribute area is read if the $\overline{REG}$ is asserted but data at a 4000H address in the common flash area is read if the $\overline{REG}$ is not asserted.

Figure 9:
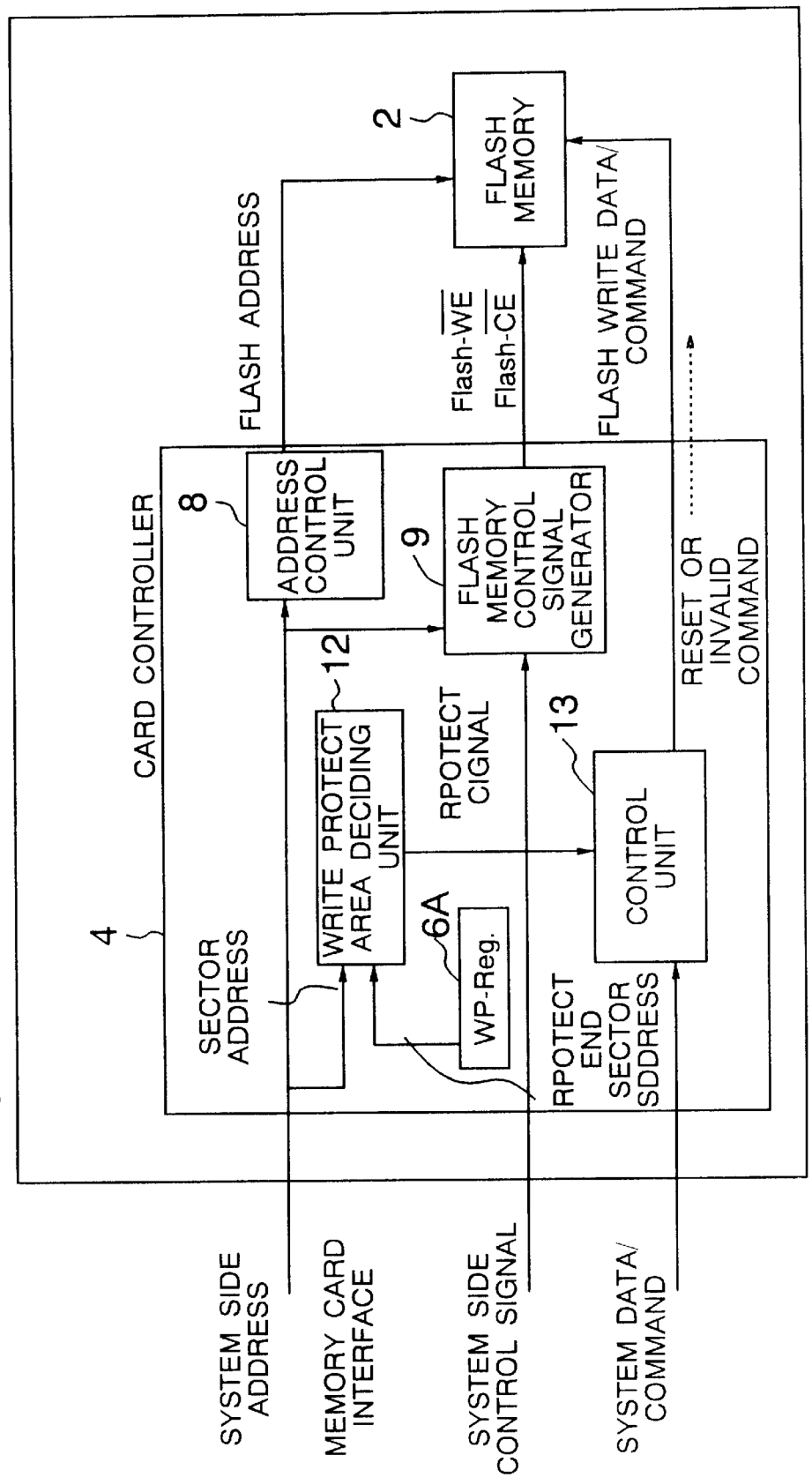
FIG. 9 is a circuit block diagram of a write protect control system in Embodiment 1.

In order to permit the write protect control function, the card controller 4 includes, as shown in a block diagram of FIG. 9 depicting a write protect control circuit, a write protect area deciding unit 12 for deciding whether an address at which the system accesses the flash memory card 1 is inside the write protect area, and a control unit or data controller 13 for controlling write of data to the flash memory 2. In the write protect area deciding unit 12, a sector address is compared with the protect end sector address and a protect signal for performing write protect control is transferred to the data controller 13.

Figure 7:
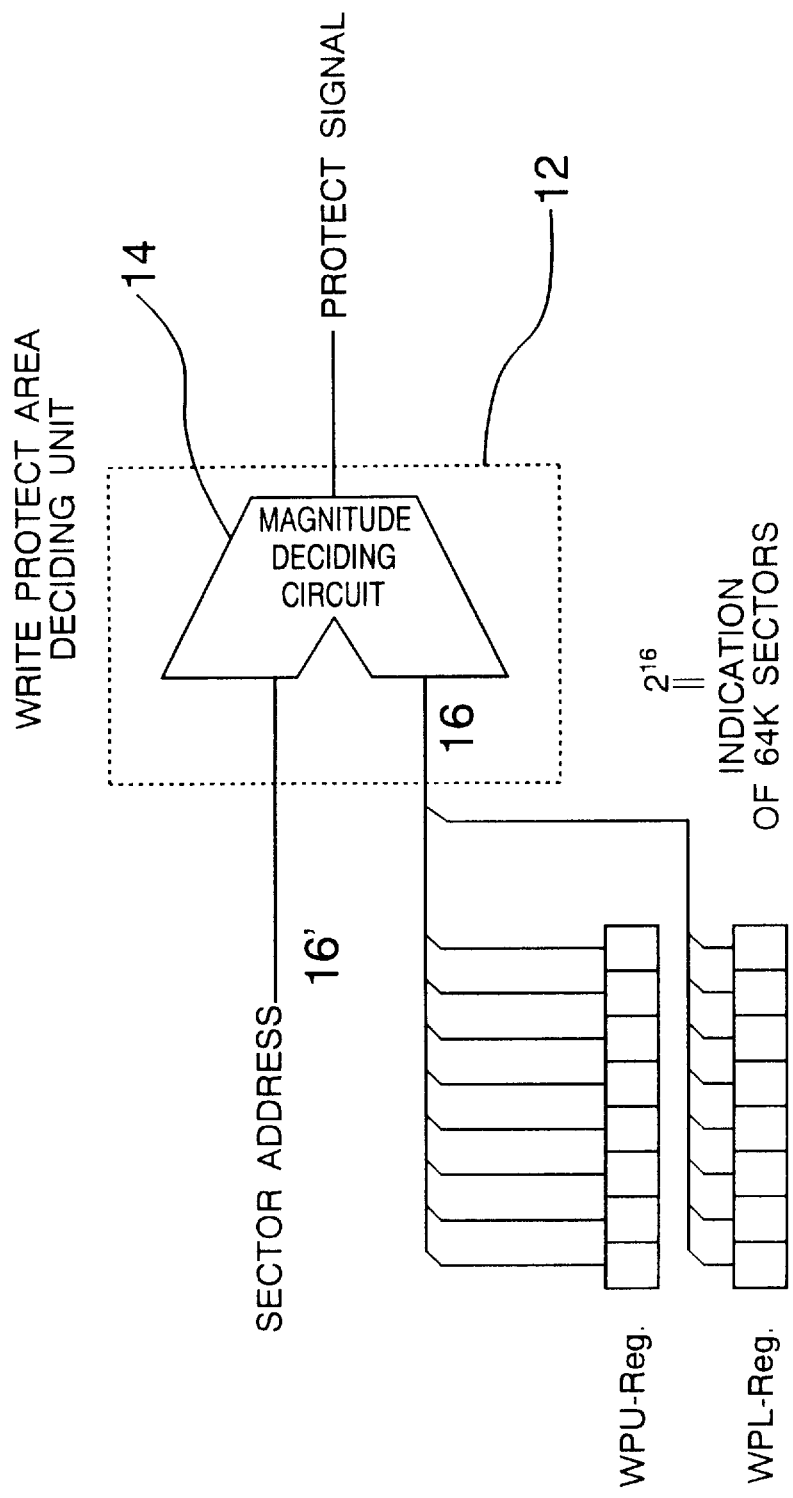
FIG. 7 is a schematic diagram showing a write protect deciding circuit in Embodiment 1.

More particularly, as shown in FIG. 7, the write protect area deciding unit 12 includes a magnitude deciding circuit 14 for comparing the sector address with the protect end sector address stored in the write protect register 6A having a write protect upper register (WPUReg.) for storing upper 8 bits of the sector address and a write protect low register (WPLReg.) for storing lower 8 bits of the sector address. The magnitude deciding circuit 14 generates a protect signal.

Operation of the write protect control circuit will be described with reference to the flow chart of FIG. 6 and the timing chart of FIG. 8.

Firstly, when write access signals $\overline{CE}$ and $\overline{WE}$ from the system side to the common flash area are generated to the flash memory card 1 after software write protect has been set, the protect end address of the write protect register 6A is compared with a sector address (system Adr) accessed by the system side in the write protect area deciding unit 12 inside the card controller 4 (steps 601 and 602).

For example, if a decision result indicates that (sector address upon written into flash memory 2)≦(protect end sector address of write protect register 6A), the accessed address is determined as being inside the write protect range and consequently, a write protect signal is generated from the write protect area deciding unit 12 and is then fed to the data controller 13 so that the data controller 13 may change write data to the flash memory 2 into a reset command, (FFH) or a negating command and the command may be written to the flash memory 2 (steps 603 and 604).

This reset command is a command for resetting a write set-up state, while the negating (invalidation) command represents a command or commands excepting commands which have been set precedently in the flash memory.

On the other hand, if (sector address upon written into flash memory 2)>(protect end sector address of write protect register 6A) stands, the accessed address is determined as being outside the write protect range and normal write operation is determined, so as to write data as it is written to the flash memory 2 (steps 603 and 605).

Through this, the address accessed during the write operation is judged to determine whether it is inside the write protect range, and write protect is allowed when the accessed address is inside the write protect range but, when outside the write protect range, write protect is not allowed and normal write operation is permitted.

Figure 8:
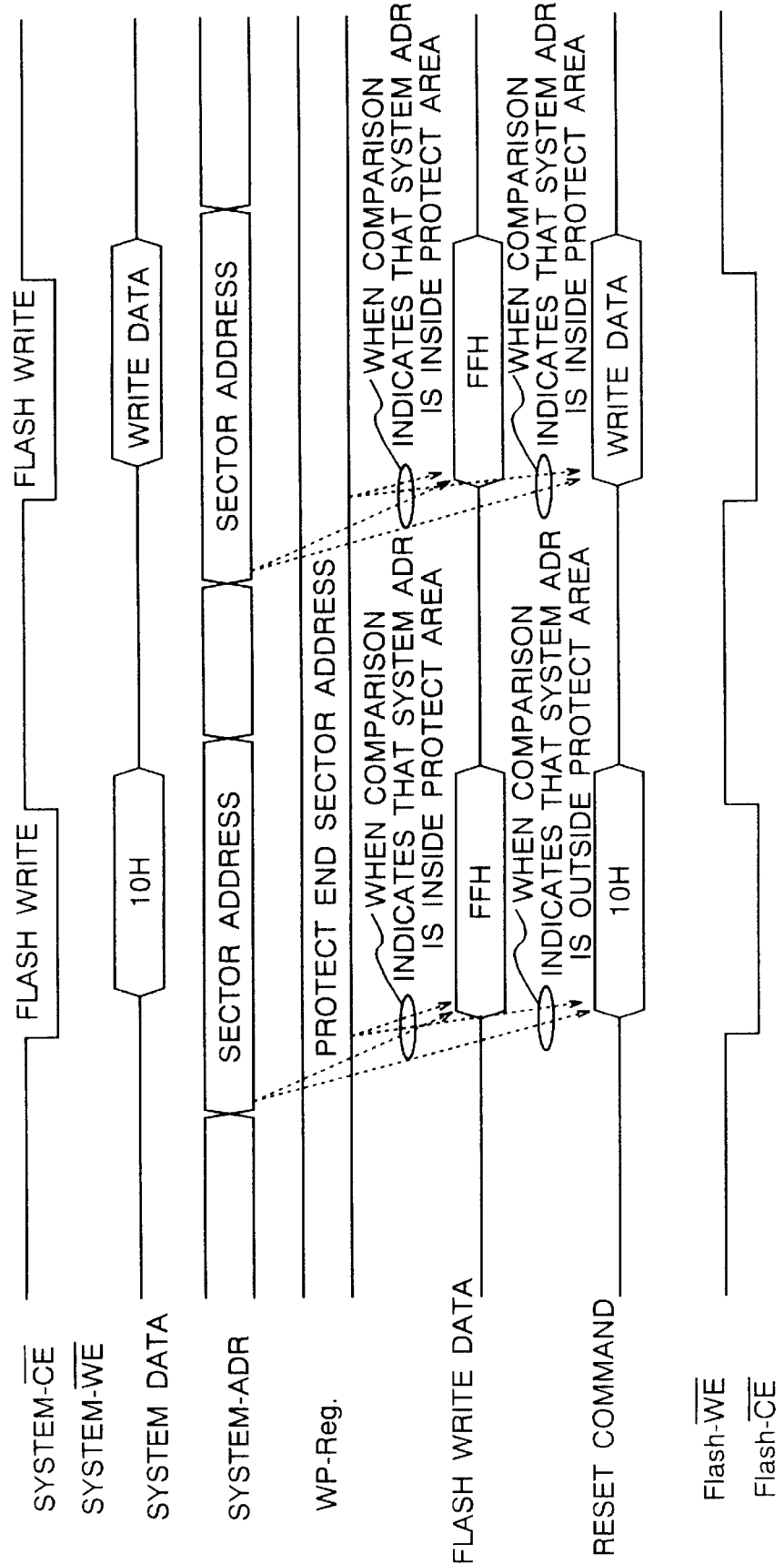
FIG. 8 is a timing chart of write protect control in Embodiment 1.

Exemplified in a timing chart of FIG. 8 is an instance where a write operation to the write protect area (autoprogram) is effected. When write to the flash memory is carried out which is inside the common flash area and inside the write protect area, a write command and data are always converted into a reset command (FFH) by means of the data controller inside the card controller and written to the flash memory. When written with the reset command, the flash memory is brought into the initial state (command wait state) and hence the write operation is not performed to achieve write protection.

Figure 10:
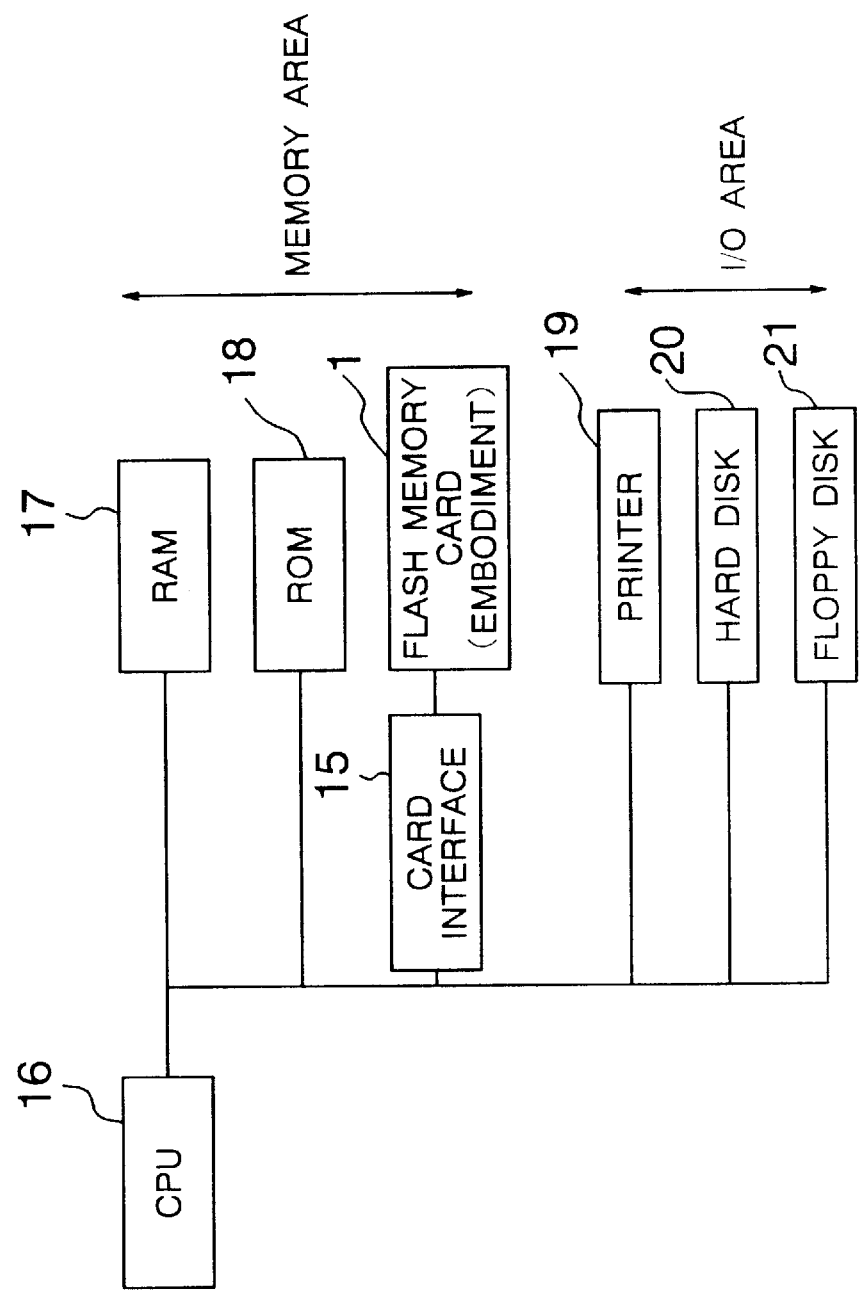
FIG. 10 is a schematic diagram of a system using the memory card of Embodiment 1.

The flash memory card 1 constructed as above is applied to a system, for example, an such as information processing apparatus as shown in FIG. 10, the system including in addition to the flash memory card 1 mounting the flash memory 2, a CPU 16, a RAM 17, a ROM 18, a printer 19, a hard disk 20 and a floppy disk 21 which are connected to the memory card 1 through a card interface 15.

In the system of FIG. 10, the RAM 17, ROM 18 and flash memory card 1, on one hand, belong to a memory area and the printer 19, hard disk 20 and floppy disk 21, on the other hand, belong to an input and output (I/O) area, whereby the card controller 4 can decide whether an address of access to the memory card 1 is inside the write protect range to thereby perform software write protect control.

Thus, in accordance with the flash memory card 1 of the present embodiment, the write protect save register area 5A is set in the flash memory 2 and an end sector address inside the write protect range is stored in the write protect save register area 5A, so that an address accessed from the user side is judged to determined whether it is inside the write protect range and write protect operation is allowed when the accessed address is inside the write protect range whereas a write protect operation is not allowed when the accessed address is outside the write protect range, thereby making it possible to perform non-volatile software write protect control at a desired area of the flash memory.

Especially, application to the flash memory card 1 using the flash memory 2 inherently not having a software write protect function and a system such as an information processing apparatus can be suitably ensured to promote the capability to maintain write protect information and data inside the write protect area. In addition, the write protect range can be set to a desired area and a protect area standing for a write inhibit area and a work area other than the protect area can be set to meet the system specification to ensure effective utilization of the flash memory 2.

(Embodiment 2)

Figure 11:
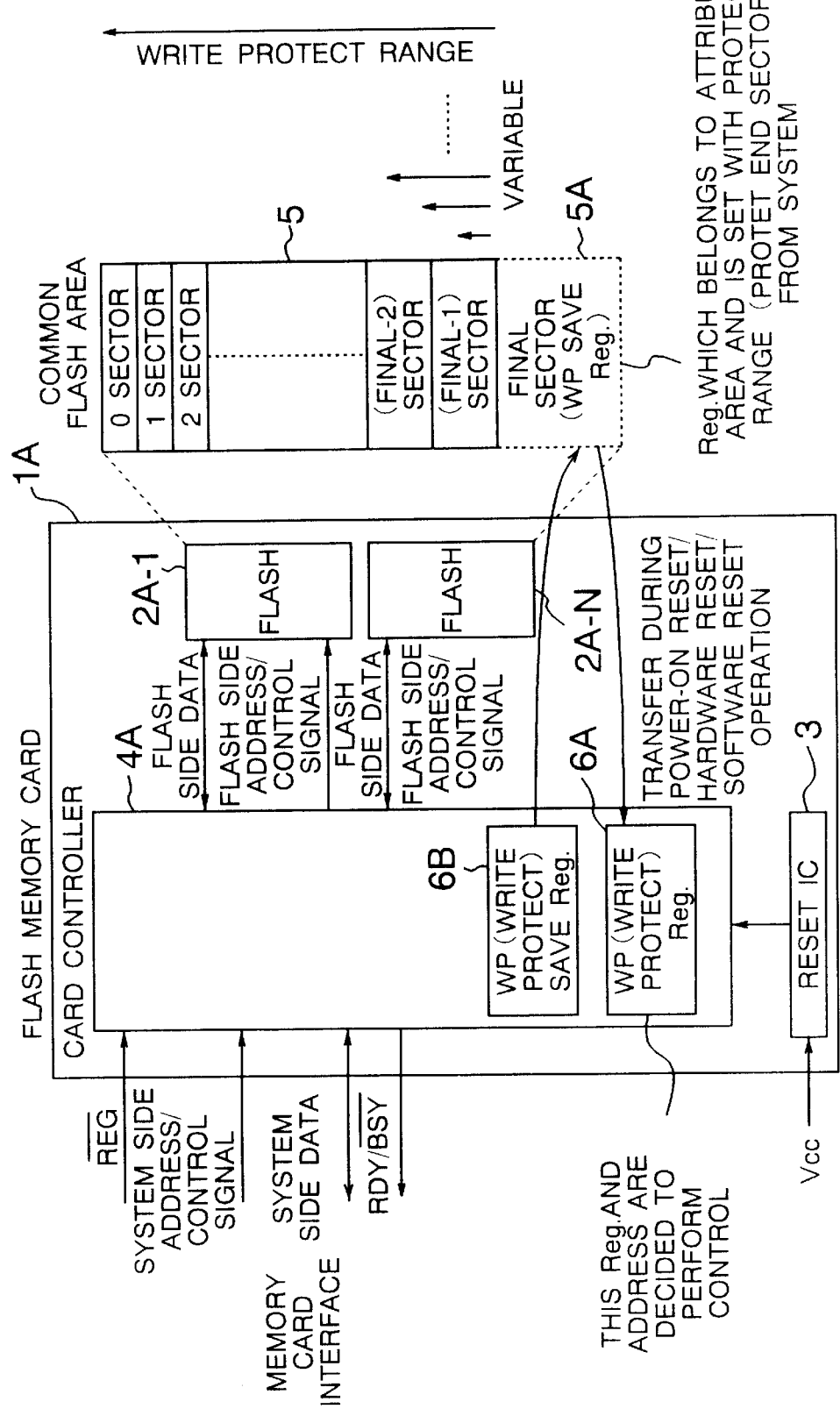
FIG. 11 is a block diagram showing the construction of a memory card using a non-volatile memory according to Embodiment 2 of the present invention.

FIG. 11 illustrates in schematic block diagram form a memory card using a non-volatile memory according to another embodiment of the present invention.

The memory card of the present embodiment is a flash memory card 1A using, like embodiment 1, a rewritable flash memory inherently without non-volatile software write protect function (non-volatile memory) 2A having flash memory devices or chips 2A-1 to 2A-N, and differs from the embodiment 1 in that the write protect range of the flash memory 2A is defined starting with a (final-1) sector.

More particularly, the write protect range (protect start sector) set in a write protect save register area 5A of the flash memory 2A can be so set as to start with the (final-1) sector of the common flash area 5 and end in a desired sector.

Accordingly, in the present embodiment, too, through control by a card controller 4A set with a write protect register (WPReg.) 6A and a write protect save register 6B, non-volatile software write protect control of the flash memory card 1A using the flash memory 2A inherently without software write protect function can be permitted in a desired area starting with the (final-1) sector.

(Embodiment 3)

Figure 12:
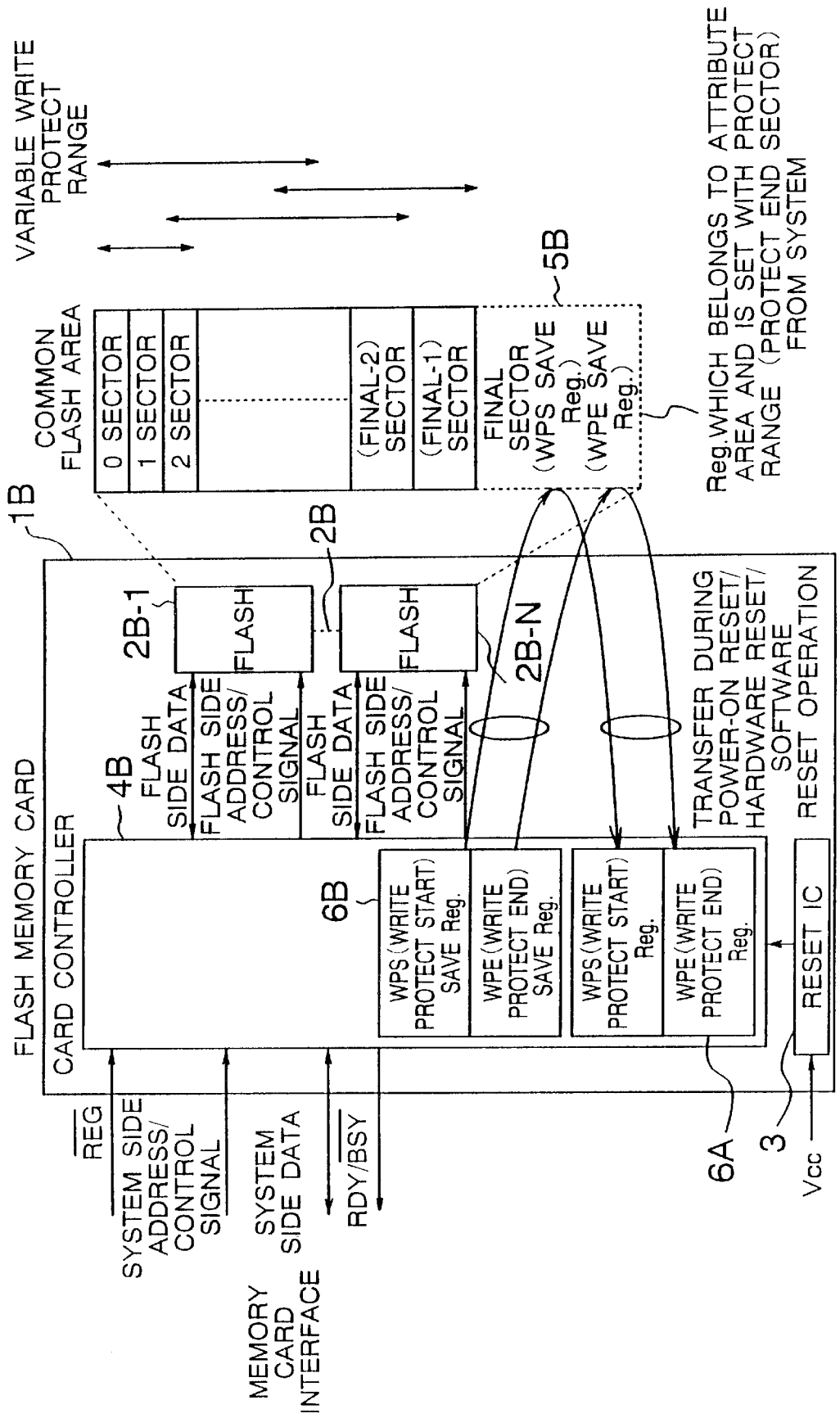
FIG. 12 is a block diagram showing the construction of a memory card using a non-volatile memory according to Embodiment 3 of the present invention.

FIG. 12 shows a memory card using a non-volatile memory according to still another embodiment of the present invention.

The memory card of the present embodiment is flash memory card 1B using, like embodiments 1 and 2, a rewritable flash memory inherently without non-volatile software write protect function (non-volatile memory) 2B having flash memory devices or chips 2B-1 to 2B-N, and differs from the embodiments 1 and 2 in that the write protect range of the flash memory 2B is defined as having a variable start address and a variable end address.

More particularly, the write protect range defined between a protect start sector and a protect end sector and set in the write protect save register 5B of the flash memory 2B can be so set as to start with a desired sector of the common flash area and end in another desired sector.

Accordingly, in the present embodiment, too, through control by a card controller 4B set with a write protect save register 6B, having a write protect start save register and a write protect end save register, and a write protect register 6A, having a write protect start register (WPSReg.) and a write protect end register (WPEReg.), non-volatile software write protect control of the flash memory card 1B using the flash memory 2B inherently without software write protect function can be performed between a desired store area and another desired store area.

(Embodiment 4)

Figure 13:
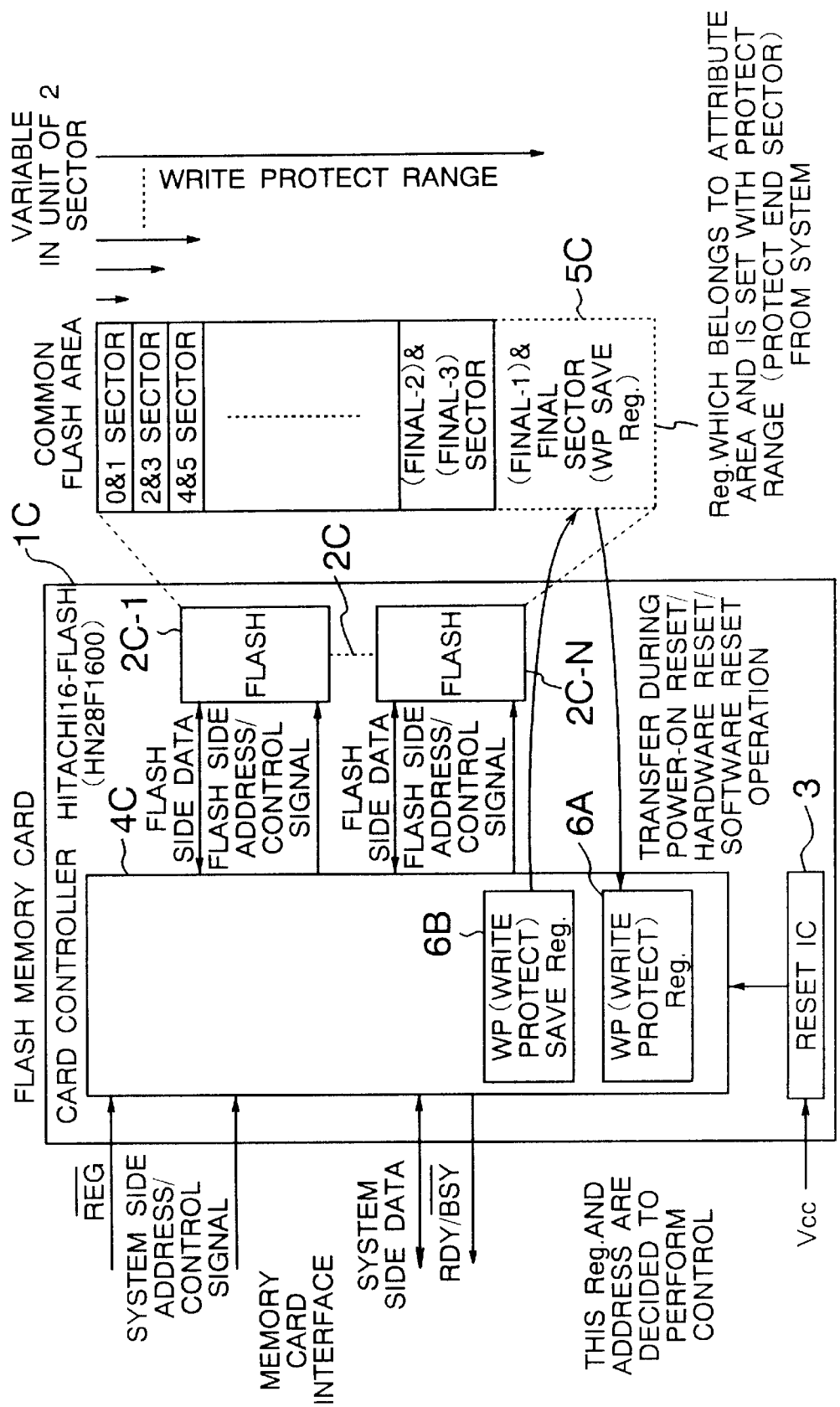
FIG. 13 is a block diagram showing the construction of a memory card using a non-volatile memory according to Embodiment 4 of the present invention.

FIG. 13 shows a memory card using a non-volatile memory according to still another embodiment of the present invention.

The memory card of the present embodiment is a flash memory card 1C using, like embodiments 1 to 3, a rewritable flash memory inherently without non-volatile software write protect function (non-volatile memory) 2C having flash memory devices or chips 2C-1 to 2C-N, and differs from the embodiments 1 to 3 in that the unit of write protect of the flash memory 2C is set to a unit of 2 sectors.

More particularly, the write protect range (protect end sector) of the write protect save register 5C set in (final-1) and final sectors of the flash memory 2C can be set in the common flash area in a unit of 2 sectors.

Accordingly, in the present embodiment, too, through control by a card controller 4C set with the write protect register (WPReg.) 6A and the write protect save register 6B, non-volatile software write protect control of the flash memory card 1C using the flash memory 2C inherently without software write protect function can be performed in a store area of 2-sector unit.

(Embodiment 5)

Figure 14:
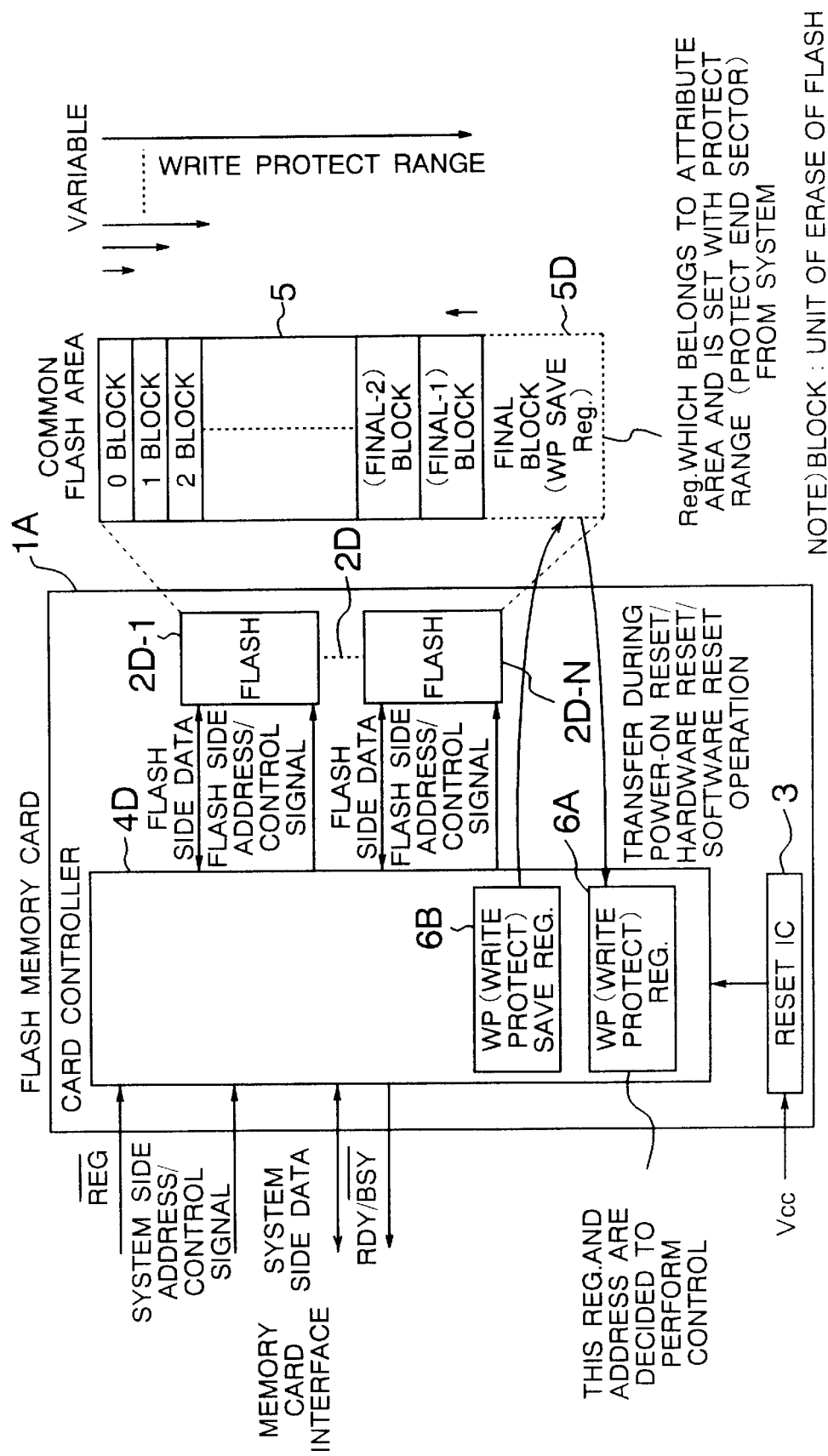
FIG. 14 is a block diagram showing the construction of a memory card using a non-volatile memory according to Embodiment 5 of the present invention.

FIG. 14 shows a memory card using a non-volatile memory according to still another embodiment of the present invention.

The memory card of the present embodiment is a flash memory card ID using, like embodiments 1 to 4, a rewritable flash memory inherently without non-volatile software write function (non-volatile memory) 2D having flash memory devices or chips 2D-1 to 2D-N, and differs from the embodiments 1 to 4 in that the unit of write protect of the flash memory 2D is not limited to the unit of sector and is set to a unit of erase of the memory, that is, a unit of block indicative of a set of a plurality of data pieces such as several sectors.

More particularly, the write protect range (protect end block) of the write protect save register 5D set in a final block of the flash memory 2D can be set in a unit of block of the flash memory in the common flash area.

Accordingly, in the present embodiment, too, through control by a card controller 4D set with a write protect register (WPReg.) 6A and a write protect save register 6B, non-volatile software write protect control of the flash memory card 1D using the flash memory 2D inherently without software write protect function can be performed in an area of a unit of block of flash memory.

(Embodiment 6)

Figure 15:
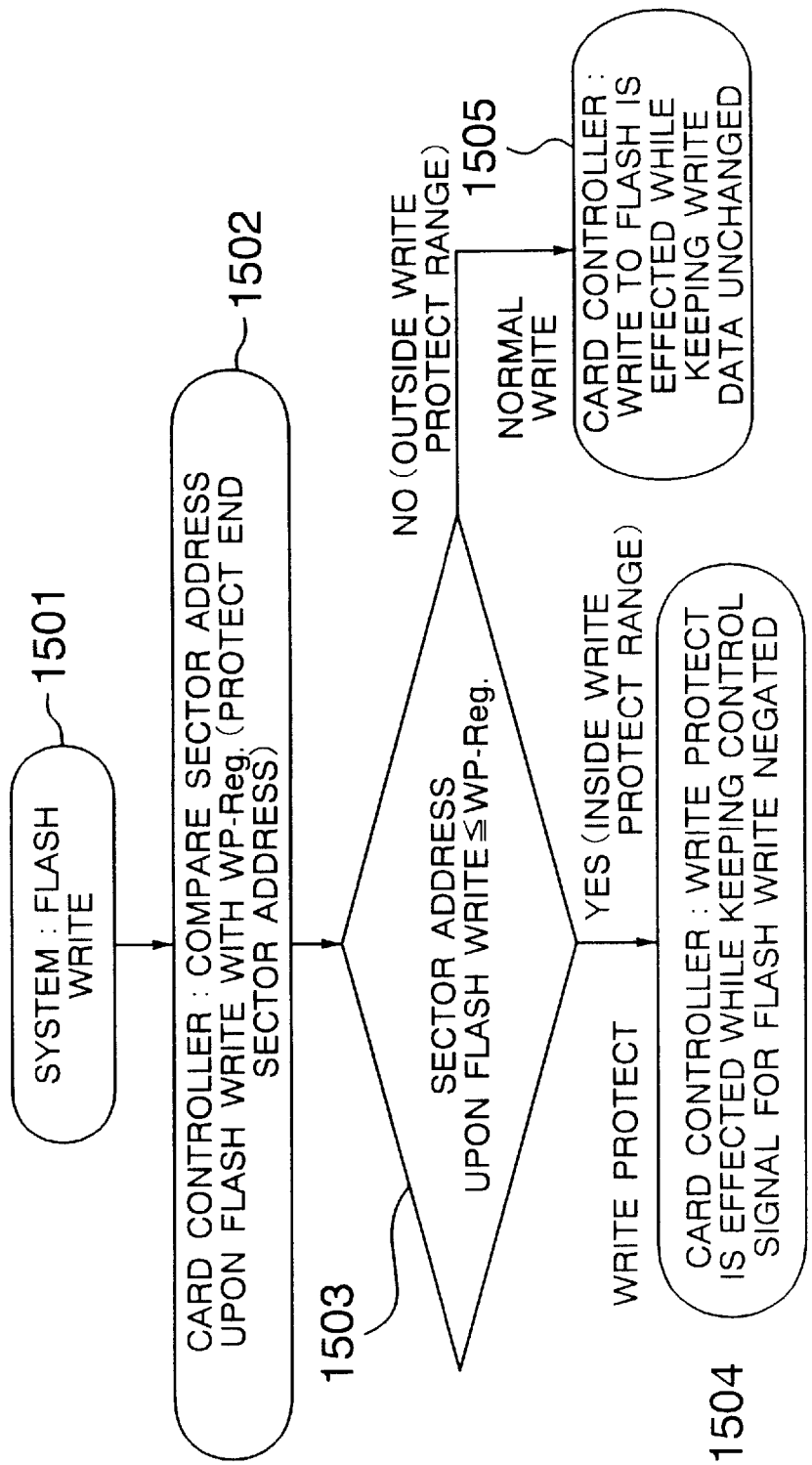
FIG. 15 is a flow chart of write protect control in a memory card using a non-volatile memory according to Embodiment 6 of the present invention.

A still another embodiment of the present invention will be described with reference to FIG. 15 and FIGS. 16A to 16C. FIG. 15 shows a flow chart of write protect control in a memory card using a non-volatile memory, FIG. 16A a timing chart of write protect control, FIG. 16B an example of hardware construction of the essential part of the present embodiment, and FIG. 16C a timing chart of operation of the FIG. 16B hardware.

The memory card of the present embodiment is constructed similarly to the aforementioned embodiments, especially embodiment 1, and is a flash memory card 1 using a rewritable flash memory inherently without non-volatile software write protect function (non-volatile memory) 2. Embodiment 6 differs from the embodiments 1 to 5 in that write protect is not performed by write data, but is performed by a control signal to the flash memory 2. The hardware of FIG. 16B differs from that of FIG. 9 in that the protect signal fed to the data controller 13 in FIG. 9 is applied to a flash memory control signal generator 9.

In the present embodiment, when a write access from the system to the common flash area is first generated to the flash memory card 1 after software write protect has been set, a protect end address of the write protect register 6A is compared with a sector address accessed from the system side (steps 1501 and 1502).

As a result, if, for example, (sector address upon write of flash memory 2)≦(protect end sector address of write protect register 6) stands, the accessed address is determined as being inside the write protect range and write protect is carried out while keeping a control signal, that is, a write enable signal ($\overline{WE}$) or a chip enable signal ($\overline{CE}$) for write negated (high level) (steps 1503 and 1504).

On the other hand, if (sector address upon write of flash memory 2)>(protect end sector address of write protect register 6) stands, the accessed address is determined as being outside the write protect range and the normal write operation is determined, so that write data as it is written to the flash memory 2 (steps 1503 and 1505).

Figure 16B:
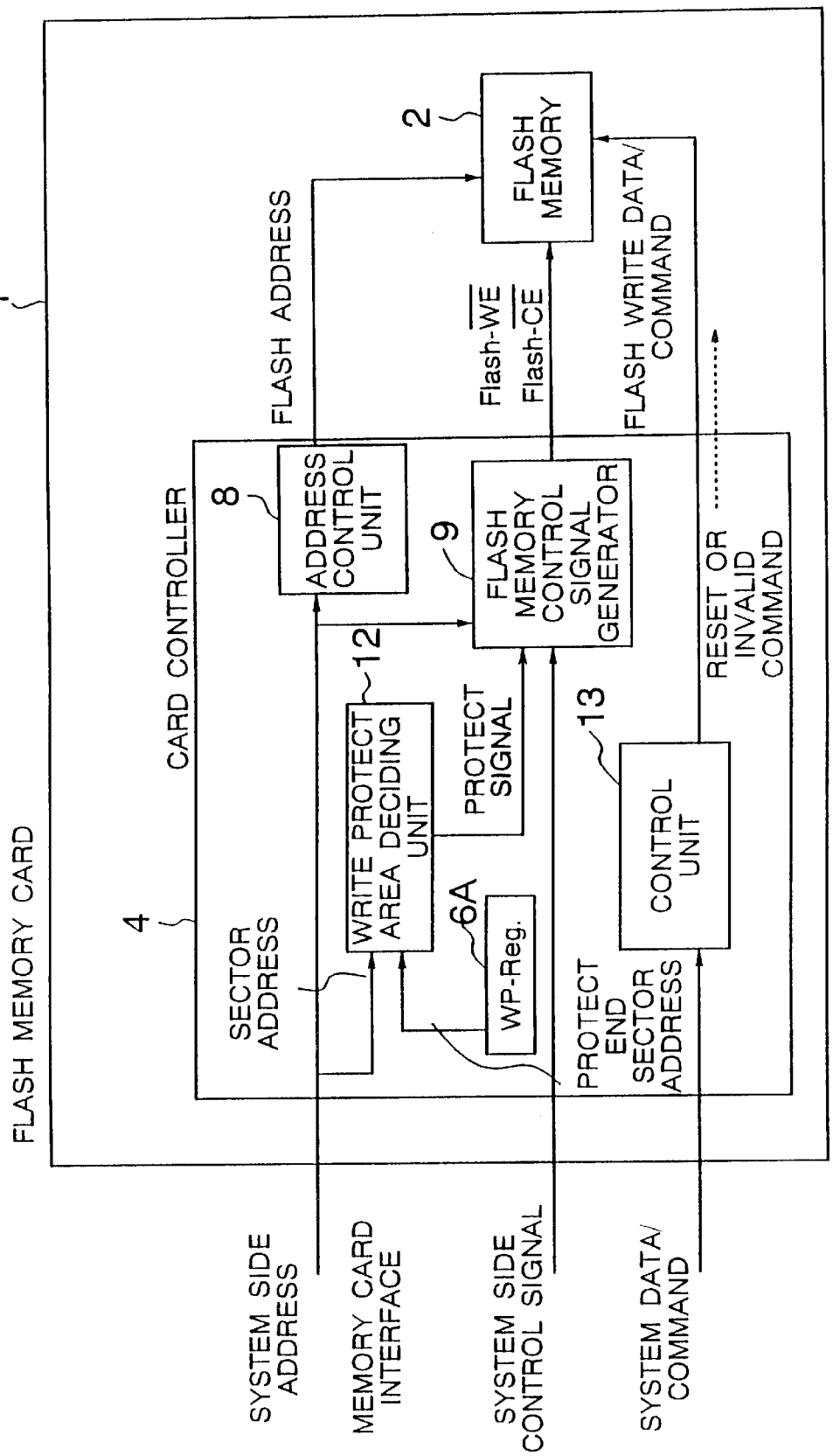
FIG. 16B is a circuit block diagram showing an example of implementation of write protect control.
Figure 16C:
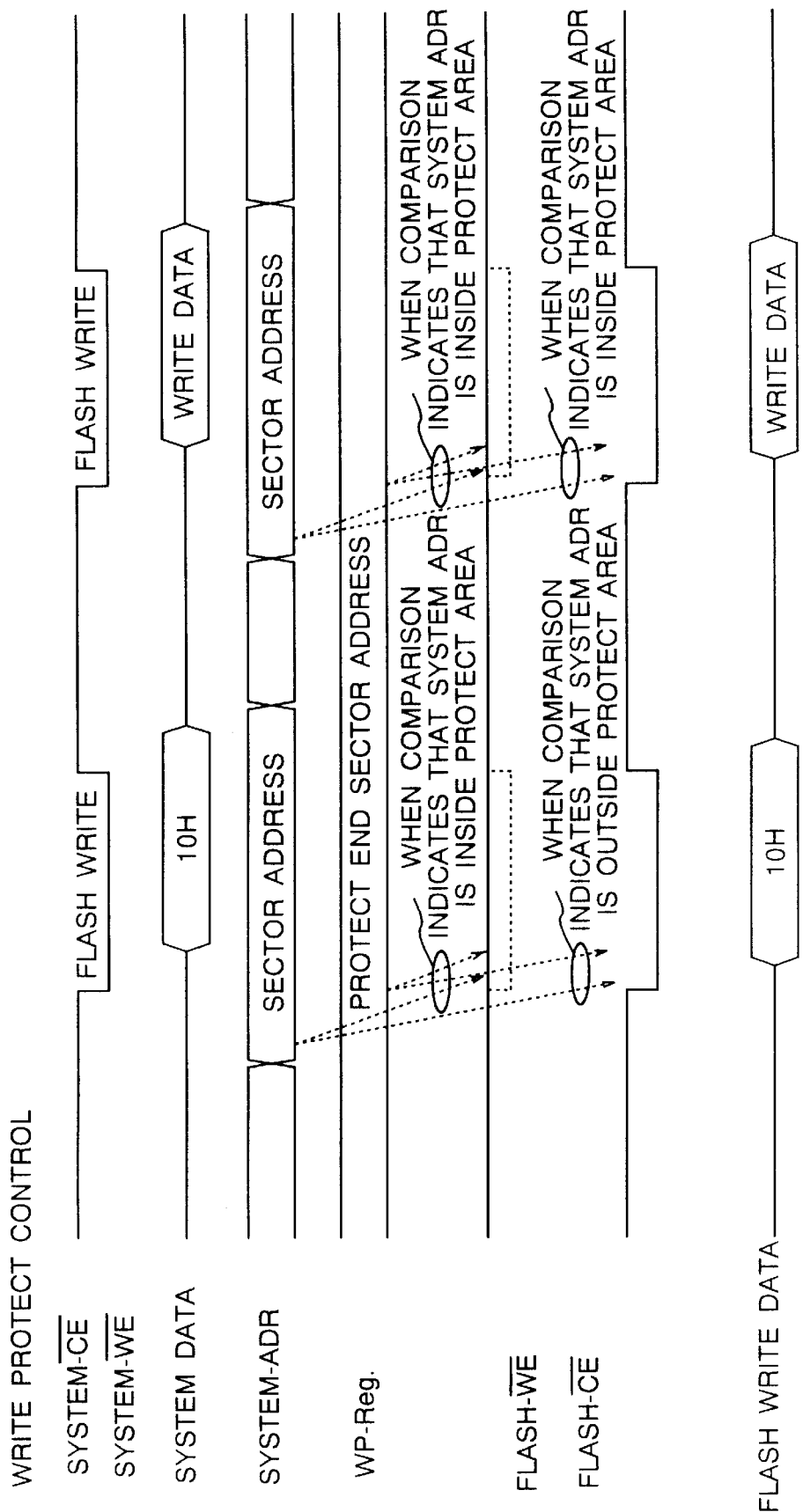
FIG. 16C is a timing chart showing another method for implementation of write protect control.

To explain the example of FIG. 16B with reference to a timing chart of FIG. 16C, this example is an instance where writing to the write protect area (auto-program) is carried out. When data writing to the flash memory is carried out which is inside the common flash area and inside the write protect area, a write command and data are not converted and the flash memory control signal generator inside the card controller negates or does not assert the flash side $\overline{CE}$ or flash side $\overline{WE}$. This will account for the fact that writing is not carried out and hence, the write protect can be achieved.

Accordingly, in the present embodiment, too, an address accessed from the user side is decided as to whether to be inside the write protect range and if inside the write protect range, a control signal for writing is negated to permit write protection but if outside the write protect range, write protection is not allowed to ensure that non-volatile software write protect control can be permitted in a desired store area.

(Embodiment 7)

Figure 17:
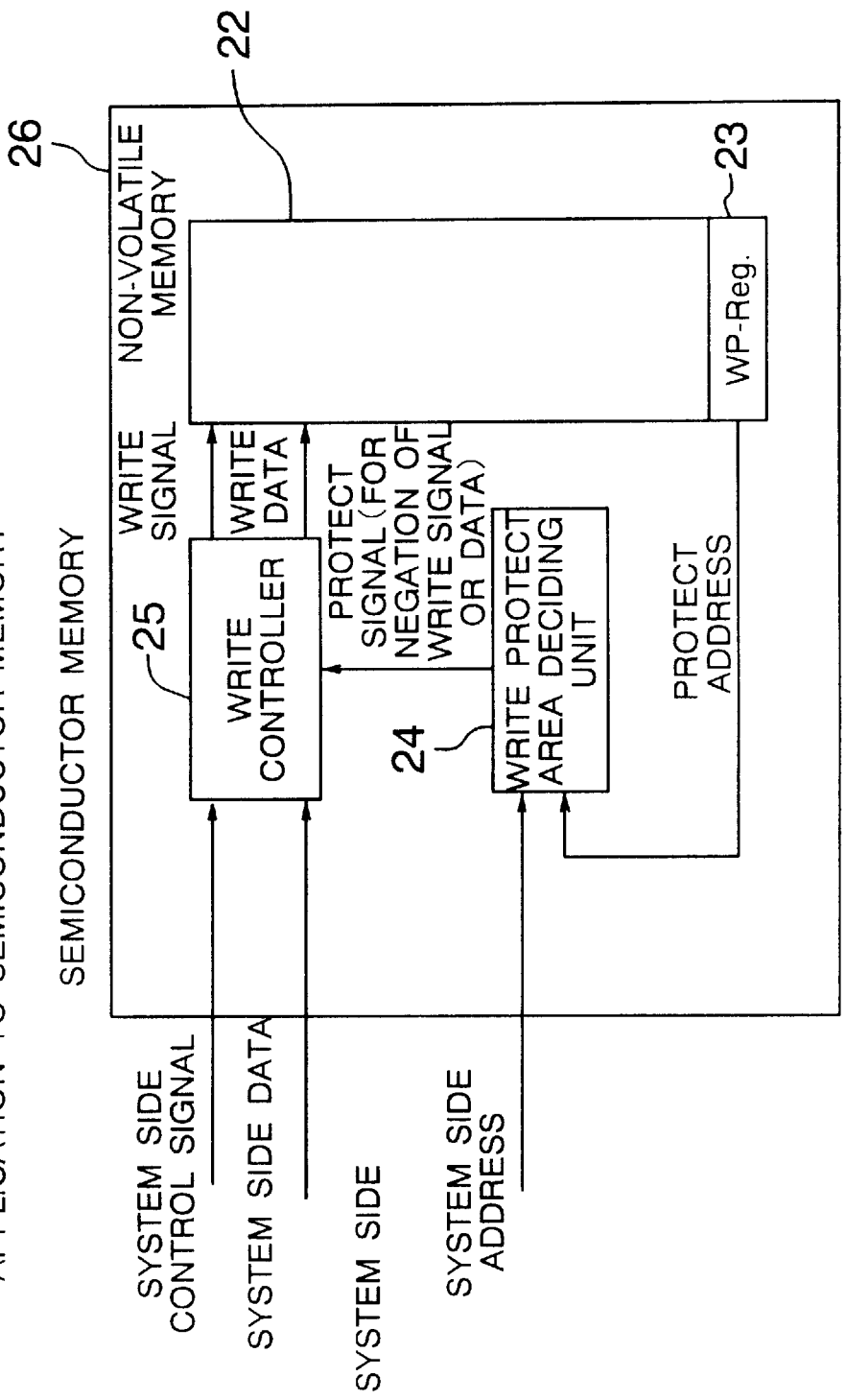
FIG. 17 is a schematic diagram showing a semiconductor memory using a non-volatile memory according to Embodiment 7 of the present invention.

FIG. 17 shows a semiconductor memory using a non-volatile memory according to still another embodiment of the present invention.

The present embodiment differs from embodiments 1 to 6 in that a non-volatile memory 22 per se has a write protect register 23, a semiconductor memory 26 includes a write protect area deciding unit 24 for deciding whether an address accessed by the system side is inside the write protect range and a write controller 25 for controlling a write signal and write data to the non-volatile memory 22, and a protect signal from the write protect area deciding unit 24 is used to control the write data or write signal, thereby permitting write protect control of the non-volatile memory 22.

More specifically, in the present embodiment, the integrated semiconductor memory 26 such as for example a flash memory is realized to have the write protect function and when a decision result by the write protect area deciding unit 24 indicates that the accessed address is inside the write protect range, the write protect area deciding unit 24 generates a write protect signal which in turn is fed to the write controller 25 to render the write signal ($\overline{CE}$, $\overline{WE}$) to the non-volatile memory 22 high level or make the write data a reset command or a negating command.

Accordingly, in the present embodiment, a protect address set in the write protect register 23 of the non-volatile memory 22 is compared with an address accessed to the non-volatile memory 22 and write protect control is allowed if the accessed address is inside the write protect range but is not allowed if outside the write protect range, thereby permitting non-volatile software write protect when the non-volatile memory 22 per se has the write protect register 23.

Figure 18:
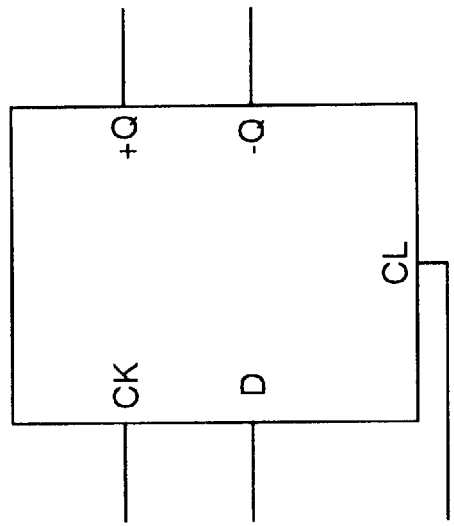
FIG. 18 is a diagram showing an embodiment of a flip-flop constituting a register provided in the card controller and a truth table of operation of the flip-flop.

A flip-flop constituting various registers in the controller excepting the WP save register in the foregoing embodiments is exemplified along with its operational truth table in FIG. 18. It will be understood that the flip-flop is volatile.

Figure 19:
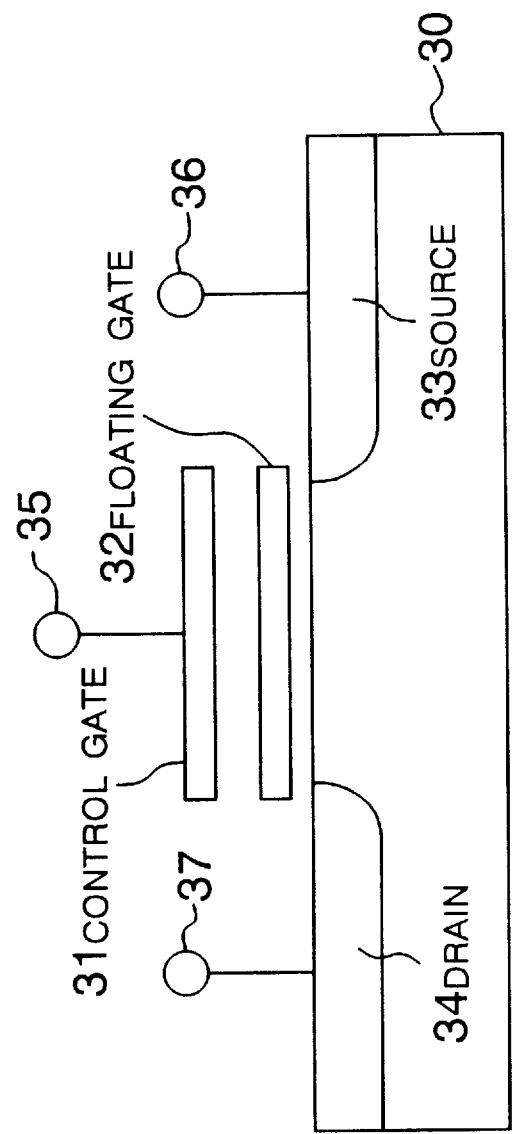
FIG. 19 is a sectional view of a memory cell exemplifying a flash memory used in the present invention.

A flash memory cell used in the present embodiment is exemplified in sectional structural form in FIG. 19. The cell is formed of a MOSFET including a semiconductor substrate 30 and a two-layer structure of control gate 31 and a floating gate 32 formed on the semiconductor substrate 30. Denoted by 33 and 34 are a source and a drain, respectively, by 36 and 37 are a source electrode and a drain electrode, respectively, and by 35 is a gate electrode.

While the invention made by the present inventors has been described specifically by way of embodiments 1 to 7, the present invention is in no way limited to the foregoing embodiments and obviously can be changed in various ways without departing from the gist of the present invention.

For example, the flash memory in the foregoing embodiments has been described as being set with the write protect save register set in the final chip or final sector of the common flash area but the present invention is not limited to the foregoing embodiments and can also be applied to a case where the write protect save register is set in the heading chip or heading sector of the common flash memory area.

Further, along with setting of the write protect save register, the write protect range and the erase unit can obviously be set suitably in compliance with functional specifications of the flash memory.

Furthermore, the non-volatile memory of the present embodiment can also be applied to, in addition to the flash memory, another type of non-volatile memory such as an EEPROM which is electrically erasable and writable bit by bit. It can also be applied widely to a system using a non-volatile memory, for example, general information processing apparatus and general memory cards as well as non-volatile memory devices.

We claim:

1. A method for software write protect control of a rewritable non-volatile memory using a memory card on which said non-volatile memory is mounted, comprising the steps of:

setting a write protect save register in said non-volatile memory;

writing write protect information indicating a protect area into said write protect save register;

transferring said write protect information from said protect save register to a write protect register inside a card controller of said memory card by performing a reset operation;

judging an address of a store location of said memory subsequently accessed by the user to determine whether the accessed location address is inside a write protect area; and causing a write protect operation of said memory to be allowed when the accessed location address is inside the write protect area but not to be allowed when the accessed address is outside the write protect area, thereby performing software write protect control.

* * * * *